US012696487B2

(12) United States Patent
Hasan et al.

(10) Patent No.: US 12,696,487 B2
(45) Date of Patent: Jul. 28, 2026

(54) SELECTIVELY THINNED GATE-ALL-AROUND (GAA) STRUCTURES

(71) Applicant: Intel Corporation, Santa Clara, CA (US)

(72) Inventors: Mohammad Hasan, Aloha, OR (US); Tahir Ghani, Portland, OR (US); Pratik A. Patel, Portland, OR (US); Leonard P. Guler, Hillsboro, OR (US); Mohit K. Haran, Hillsboro, OR (US); Clifford L. Ong, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 611 days.

(21) Appl. No.: 17/473,431

(22) Filed: Sep. 13, 2021

(65) Prior Publication Data

US 2023/0079586 A1      Mar. 16, 2023

(51) Int. Cl.
$$\begin{array}{ll} \textbf{\textit{H10D 30/67}} & (2025.01) \\ \textbf{\textit{H10D 30/01}} & (2025.01) \\ \textbf{\textit{H10D 62/10}} & (2025.01) \end{array}$$

(52) U.S. Cl.
CPC ....... _H10D 30/6735_ (2025.01); _H10D 30/031_ (2025.01); _H10D 30/6713_ (2025.01); _H10D 30/6757_ (2025.01); _H10D 62/119_ (2025.01)

(58) Field of Classification Search
CPC ............. H10D 30/6735; H10D 62/121; H10D 30/024; H10D 62/119; H10D 84/832
See application file for complete search history.

(56) References Cited

U.S. PATENT DOCUMENTS

| | | | |
|---|---|---|---|
| 2013/0244392 A1* | 9/2013 | Oh | ..................... H10D 84/0193 |
| | | | 438/299 |
| 2019/0123176 A1 | 4/2019 | Wan et al. | |
| 2020/0006478 A1 | 1/2020 | Hsu et al. | |
| 2021/0159232 A1* | 5/2021 | Liaw | ..................... B82Y 10/00 |

FOREIGN PATENT DOCUMENTS

| | | |
|---|---|---|
| WO | 2015147783 A1 | 10/2015 |
| WO | 2015147836 A1 | 10/2015 |

OTHER PUBLICATIONS

Extended European Search Report received for EP Application No. 22190217.4. Mail date: Feb. 13, 2023. 8 pages.

* cited by examiner

_Primary Examiner_ — Fernando L Toledo
_Assistant Examiner_ — Warwick R Steer
(74) _Attorney, Agent, or Firm_ — Finch & Maloney PLLC

(57) ABSTRACT

Techniques are provided herein to form semiconductor devices having thinned semiconductor regions (e.g., thinner nanoribbons) compared to other semiconductor devices on the same substrate and at a comparable height (e.g., within same layer or adjacent layers). In an example, neighboring semiconductor devices of a given memory cell include a p-channel device and an n-channel device. The p-channel device may be a GAA transistor with a semiconductor nanoribbon having a first width while the n-channel device may be a GAA transistor with a semiconductor nanoribbon having a second width that is larger than the first width (e.g., first width is half the second width). The p-channel device may have a thinner width than the corresponding n-channel device in order to structurally lower the operating current through the p-channel devices by decreasing the width of the active semiconductor channel.

20 Claims, 12 Drawing Sheets

102

104

207

108      110      108      110      108

106

102      208      104      208

108      108      108

106

<u>500</u>

FORM FIRST AND SECOND MULTILAYER FINS — 502

FORM HELMET STRUCTURES ON FIRST AND SECOND MULTILAYER FINS — 504

MASK SECOND MULTILAYER FIN — 506

LATERALLY ETCH THE FIRST MULTILAYER FIN TO REDUCE A WIDTH OF THE FIRST MULTILAYER FIN — 508

COMPLETE FORMATION OF THE SEMICONDUCTOR DEVICES — 510

SELECTIVELY THINNED GATE-ALL-AROUND (GAA) STRUCTURES

FIELD OF THE DISCLOSURE

The present disclosure relates to integrated circuits, and more particularly, to gate-all-around (GAA) semiconductor devices.

BACKGROUND

As integrated circuits continue to scale downward in size, a number of challenges arise. For instance, reducing the size of memory and logic cells is becoming increasingly more difficult. Energy consumption of so many semiconductor devices becomes an increasing concern. Some processor cores employ voltage scaling techniques to decrease the energy consumption of the integrated circuit, however this makes the various semiconductor devices more susceptible to process and/or dopant variations that can cause the devices to not function properly. Accordingly, there remain a number of non-trivial challenges with respect to designing semiconductor devices that can function at lower voltage levels.

Figure 1A:
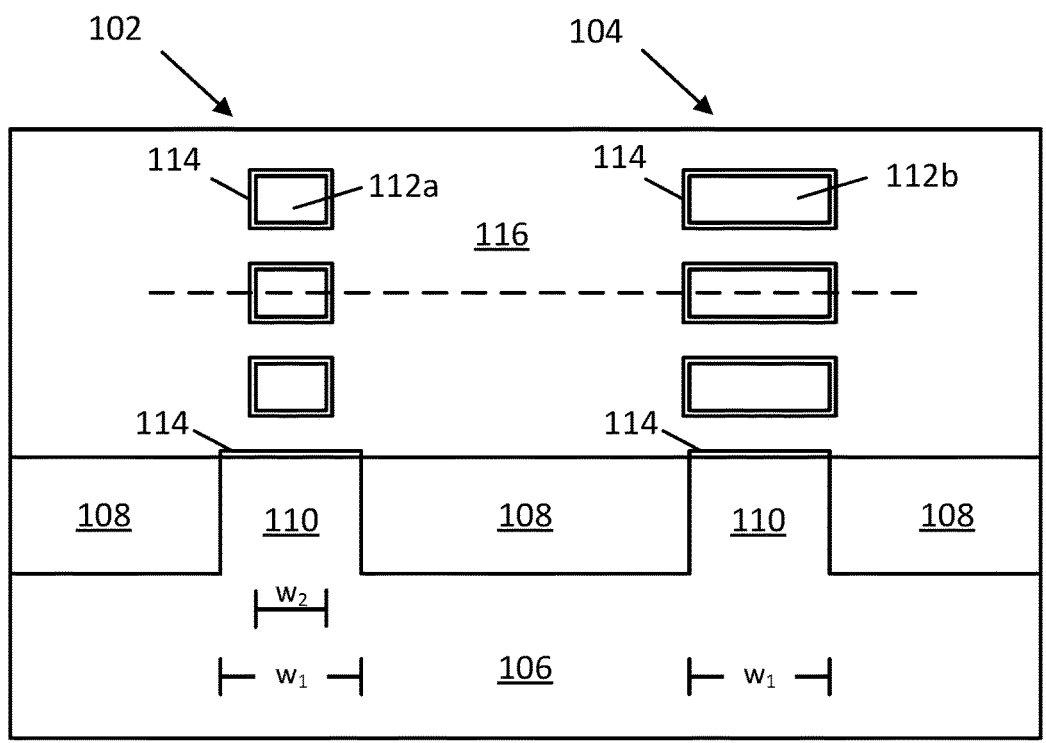
FIGS. 1A and 1B are cross-sectional views that illustrate an example integrated circuit having semiconductor devices with thinned semiconductor regions, in accordance with an embodiment of the present disclosure.

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles, and some features may have surface topology or otherwise be non-smooth, given real world limitations of the processing equipment and techniques used.

DETAILED DESCRIPTION

Techniques are provided herein to form semiconductor devices having thinned semiconductor regions (e.g., thinner nanoribbons) compared to other semiconductor devices on the same substrate. The techniques can be used in any number of integrated circuit applications and are particularly useful with respect to logic and memory cells, such as those cells that use gate-all-around (GAA) transistors. In an example, neighboring semiconductor devices of a given memory cell, such as a synchronous random access memory (SRAM) cell, include a p-channel device and an n-channel device. More specifically, the p-channel device may be a GAA transistor with a semiconductor nanoribbon having a first width while the n-channel device may be a GAA transistor with a semiconductor nanoribbon having a second width that is larger than the first width. Note this difference in width can be seen in a cross-section taken through the channel regions and perpendicular to the fin structures from which the nanoribbons are formed. Further note that, in such a cross-section, an imaginary horizontal plane may pass through at least a portion of the two nanoribbons, such that they are at a comparable height; in other embodiments, the two nanoribbons are at slightly different heights such that no one imaginary horizontal plane passes through both nanoribbons (such as the example case where the nanoribbons are released from two neighboring layers of a stack of alternating layers). In some cases, the width of the p-channel device nanoribbon is around half of the width of the n-channel device nanoribbon. According to an embodiment, the p-channel devices are made to have a thinner width than the corresponding n-channel devices in order to structurally lower the operating current through the p-channel devices by decreasing the width of the active semiconductor channel. Numerous variations and embodiments will be apparent in light of this disclosure.

General Overview

As previously noted above, there remain a number of non-trivial challenges with respect to designing semiconductor devices that consume less energy. As operating voltages decrease, the successful operation of the semiconductor devices of an integrated circuit becomes more susceptible to systemic process variations and/or random dopant fluctuations. In the example of a memory cell, such random dopant and/or process variations could result, for instance, in a p-channel device with a higher drive current than the corresponding n-channel device (strong p-type device and weak n-type device), which can lead to memory write errors. In particular, such a memory cell cannot be written to below some minimum voltage (write failure below Vmin). Some techniques have been implemented to mitigate write failures, but they incur additional power consumption and take up valuable chip footprint, and are relatively difficult to design for (layout).

Thus, and in accordance with an embodiment of the present disclosure, techniques are provided herein to form selectively thinned transistor structures. By selectively thinning the semiconductor regions of the p-channel devices compared to the n-channel devices, the drive current through the p-channel devices is lowered and easier to control. Thus, the thinning techniques provide a structural solution to reducing potential write errors in memory cells. Although many transistor designs may benefit from these techniques, they are especially useful for GAA structures where the nanoribbons of the p-channel device have a smaller width than the corresponding nanoribbons of a corresponding n-channel device on the same substrate. In some embodiments, the difference in width may be as high as 50%, as high as 60%, or as high as 75%. Note the techniques can be applied to other channel configurations as well, such as nanowires (or other GAA configurations) and fins (such as double-gate and tri-gate configurations), wherein the p-type nanowires or fins have a width that is thinner than the corresponding width of the n-type nanowires or fins.

In an embodiment, during the fabrication process of a given p-channel device, a dielectric helmet or protective structure is formed over a fin of semiconductor material, according to an embodiment. The helmet structure protects the top portion of the fin during an isotropic etching process that laterally etches the exposed portion of the fin to reduce a total width of the fin. Once the helmet structure has been removed, the remainder of the fabrication process may proceed the same for both the p-channel device and any other n-channel devices. Subsequent processing may include, for example, the selective etching of sacrificial layers (e.g., silicon germanium layers) included in the fins, so as to release the nanoribbons (e.g., silicon).

According to an embodiment, an integrated circuit includes a first semiconductor device having a first semiconductor nanoribbon extending between a first source region and a first drain region, and a second semiconductor device having a second semiconductor nanoribbon extending between a second source region and a second drain region. The first semiconductor nanoribbon has a length and a first width. The length corresponds to a first distance between the source and drain regions, and the width corresponds to a second distance between sidewalls of the first nanoribbon, the second distance extending in a direction that is orthogonal to a direction in which the first distance extends. The second semiconductor nanoribbon may have the same length as the first semiconductor nanoribbon and a second width that is less than the first width. The nanoribbon lengths may be considered to be the same if they are at least within 1 nm of each other. In other embodiments, the nanoribbon lengths may be different.

According to another embodiment, an electronic device includes a chip package having one or more dies. At least one of the one or more dies includes a first semiconductor device having a first body of semiconductor material extending between a first source region and a first drain region and having a first subfin beneath the first body of semiconductor material, and a second semiconductor device having a second body of semiconductor material extending between a second source region and a second drain region and having a second subfin beneath the second body of semiconductor material. A first gate dielectric layer wraps around the first body of the semiconductor material, and a second gate dielectric layer wraps around the second body of semiconductor material. The first body of semiconductor material has a first width that may be substantially the same as a width of the first subfin and the second body of semiconductor material has a second width that is less than a width of the second subfin as well as less than the width of the first body of semiconductor material.

According to another embodiment, a method of forming an integrated circuit includes forming a first multilayer fin and a second multilayer fin, each of the first and second multilayer fins comprising first and second material layers, wherein the second material layers comprise a semiconductor material suitable for use as a nanoribbon channel; forming a helmet structure on a top surface of the first multilayer fin and the second multilayer fin; masking the second multilayer fin while leaving the first multilayer fin exposed; and performing a lateral etching process on the sidewalls of the first multilayer fin to reduce a width of the first multilayer fin.

As noted above, the techniques are especially suited for use with nanowire and nanoribbon transistors (e.g., gate-all-around transistors), but may also be applicable in some instances to finFET devices. The source and drain regions can be, for example, doped portions of a given fin or substrate, or epitaxial regions that are deposited during an etch-and-replace source/drain forming process. The dopant-type in the source and drain regions will depend on the polarity of the corresponding transistor. The gate structure can be implemented with a gate-first process or a gate-last process (sometimes called a remove metal gate, or RMG, process). Any number of semiconductor materials can be used in forming the transistors, such as group IV materials (e.g., silicon, germanium, silicon germanium) or group III-V materials (e.g., gallium arsenide, indium gallium arsenide).

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For instance, in some example embodiments, such tools may indicate some p-type semiconductor devices having nanoribbons with a smaller width compared to corresponding nanoribbons of other n-type semiconductor devices. In some embodiments, such tools may indicate semiconductor devices having nanoribbons with a smaller width compared to a width of the subfin regions of the same semiconductor devices (beyond relatively slight tapering of fin structures attributable to process-limitations, rather than intentional thinning). In some embodiments, such tools may indicate one or more semiconductor devices that have undercut regions at the upper edges of the subfins that are under the nanoribbons with the smaller width. In this manner the upper edges of the subfins that are under the nanoribbons with the smaller width may be tapered or otherwise have a concave or angled profile, while the upper edges of the subfins that are under the non-thinned nanoribbons are not.

It should be readily understood that the meaning of "above" and "over" in the present disclosure should be interpreted in the broadest manner such that "above" and "over" not only mean "directly on" something but also include the meaning of over something with an intermediate feature or a layer therebetween. Further, spatially relative terms, such as "beneath," "below," "lower," "above," "upper," and the like, may be used herein for ease of description to describe one element or feature's relationship to another element (s) or feature (s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "layer" refers to a material portion including a region with a thickness. A monolayer is a layer that consists of a single layer of atoms of a given material. A layer can extend over the entirety of an underlying or overlying structure, or may have an extent less than the extent of an underlying or overlying structure. Further, a layer can be a region of a homogeneous or inhomogeneous continuous structure, with the layer having a thickness less than the thickness of the continuous structure. For example, a layer can be located between any pair of horizontal planes between, or at, a top surface and a bottom surface of the continuous structure. A layer can extend horizontally, vertically, and/or along a tapered surface. A layer can be conformal to a given surface (whether flat or curvilinear) with a relatively uniform thickness across the entire layer.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer.

Architecture

FIG. 1A is a cross sectional view taken across two example semiconductor devices 102 and 104, according to an embodiment of the present disclosure. Each of semiconductor devices 102 and 104 may be non-planar metal oxide semiconductor (MOS) transistors, such as tri-gate or gate-all-around (GAA) transistors, although other transistor topologies and types could also benefit from the techniques provided herein. The illustrated embodiments herein use the GAA structure. Semiconductor devices 102 and 104 represent a portion of an integrated circuit that may contain any number of similar semiconductor devices.

As can be seen, semiconductor devices 102 and 104 are formed on a substrate 106. Any number of semiconductor devices can be formed on substrate 106, but two are used here as an example. Substrate 106 can be, for example, a bulk substrate including group IV semiconductor material (such as silicon, germanium, or silicon germanium), group III-V semiconductor material (such as gallium arsenide, indium gallium arsenide, or indium phosphide), and/or any other suitable material upon which transistors can be formed. Alternatively, the substrate can be a semiconductor-on-insulator substrate having a desired semiconductor layer over a buried insulator layer (e.g., silicon over silicon dioxide). Alternatively, the substrate can be a multilayer substrate or superlattice suitable for forming nanowires or nanoribbons (e.g., alternating layers of silicon and SiGe, or alternating layers indium gallium arsenide and indium phosphide). Any number of substrates can be used.

The semiconductor material in each of semiconductor devices 102 and 104 may be formed from substrate 106. Semiconductor devices 102 and 104 may each include semiconductor material as nanowires or nanoribbons that can be, for example, native to substrate 106 (formed from the substrate itself). Alternatively, the semiconductor material can be formed of material deposited onto an underlying substrate. In one such example case, a blanket layer of silicon germanium (SiGe) can be deposited onto a silicon substrate, and then patterned and etched to form a plurality of SiGe fins or nanoribbons. In another such example, non-native fins can be formed in a so-called aspect ratio trapping based process, where native fins are etched away so as to leave fin-shaped trenches which can then be filled with an alternative semiconductor material (e.g., group IV or III-V material). In still other embodiments, the fins include alternating layers of material (e.g., alternating layers of silicon and SiGe) that facilitates forming of nanowires and nanoribbons during a gate forming process where one type of the alternating layers are selectively etched away so as to liberate the other type of alternating layers within the channel region, so that a gate-all-around (GAA) process can then be carried out.

As can further be seen, adjacent semiconductor devices are separated by a dielectric fill 108 that may include silicon oxide. Dielectric fill 108 provides shallow trench isolation (STI) between any adjacent semiconductor devices. Dielectric fill 108 can be any suitable dielectric material, such as silicon dioxide, aluminum oxide, or silicon oxycarbonitride.

Semiconductor device 102 includes a subfin region 110 and a plurality of nanoribbons 112a above the subfin region 110 (semiconductor device 104 similarly includes nanoribbons 112b above subfin region 110). According to some embodiments, subfin region 110 comprises the same semiconductor material as substrate 106 and is adjacent to dielectric fill 108. According to some embodiments, nanoribbons 112a and 112b extend between a corresponding source and a drain region to provide an active region for a transistor (e.g., the semiconductor region beneath the gate). The source and drain regions are not shown in the cross-section of FIG. 1A. The formation of such transistor structures is described in more detail with reference to FIGS. 3A-3H.

According to some embodiments, the source and drain regions are epitaxial regions that are provided using an etch-and-replace process. In other embodiments one or both of the source and drain regions could be, for example, implantation-doped native portions of the semiconductor fins or substrate. Any semiconductor materials suitable for source and drain regions can be used (e.g., group IV and group III-V semiconductor materials). The source and drain regions may include multiple layers such as liners and capping layers to improve contact resistance. In any such cases, the composition and doping of the source and drain regions may be the same or different, depending on the polarity of the transistors. In an example, for instance, one transistor is a p-type MOS (PMOS) transistor, and the other transistor is an n-type MOS (NMOS) transistor. Any number of source and drain configurations and materials can be used.

Nanoribbons 112a and 112b include a gate dielectric 114 that may include a single material layer or multiple stacked material layers. In some embodiments, gate dielectric 114 includes a first dielectric layer such as silicon oxide and a second dielectric layer that includes a high-K material such as hafnium oxide. The hafnium oxide may be doped with an element to affect the threshold voltage of the given semiconductor device. In some embodiments, the gate dielectric 114 around semiconductor device 102 has a different element doping concentration compared to the gate dielectric 114 around semiconductor device 104. According to some embodiments, the doping element used in gate dielectric 114 is lanthanum. Gate dielectric 114 is present around each nanoribbon 112a and 112b and may also be present over subfin portion 110. In some embodiments, gate dielectric 114 is also present over the top surface of dielectric fill 108.

According to some embodiments, a gate structure 116 extends over the nanoribbons 112a and 112b of semiconductor devices 102 and 104, respectively. Gate structure 116 may include any sufficiently conductive material such as a metal, metal alloy, or doped polysilicon. According to some embodiments, gate structure 116 may be interrupted between any adjacent semiconductor devices by a gate cut structure. In some embodiments, one or more work function metals may be included around nanoribbons 112a and 112b. In some embodiments, semiconductor device 102 is a p-channel device that includes a work function metal having titanium and semiconductor device 104 is an n-channel device that includes a work function metal having tungsten.

As discussed above, semiconductor device 102 may be a p-channel device having semiconductor nanoribbons 112a doped with n-type dopants (e.g., phosphorous or arsenic) and semiconductor device 104 may be an n-channel device having semiconductor nanoribbons 112b doped with p-type dopants (e.g., boron). Nanoribbons 112a have a smaller width ($w_2$) compared to a width ($w_1$) of nanoribbons 112b, according to some embodiments. Furthermore, the width of nanoribbons 112b may be substantially the same as the width of subfin 110. Widths may be considered to be substantially the same if they are within 1 nm of one another. Accordingly, the width $w_2$ of nanoribbons 112a may be less than the width $w_1$ of subfin 110. In some embodiments, width $w_1$ is between about 5 nm and about 8 nm, and width $w_2$ is between about 2 nm and about 4 nm. In some embodiments, width $w_2$ is at least 50% less than width $w_1$. Note that nanoribbon widths being compared can be, for example, for two laterally adjacent or neighboring nanoribbons through which an imaginary horizontal plane passes (as shown with a dashed line), according to some embodiments. In some other embodiments, the nanoribbon widths being compared may be for two nanoribbons that are offset from one another by one or two layers of a given multilayer fin structure. In such cases, the two nanoribbons being compared are at slightly different heights such that no one imaginary horizontal plane passes through both nanoribbons. In a more general sense, the two nanoribbons being compared are at a comparable height (e.g., within same horizontal plane or offset by one or two layers).

Figure 1B:
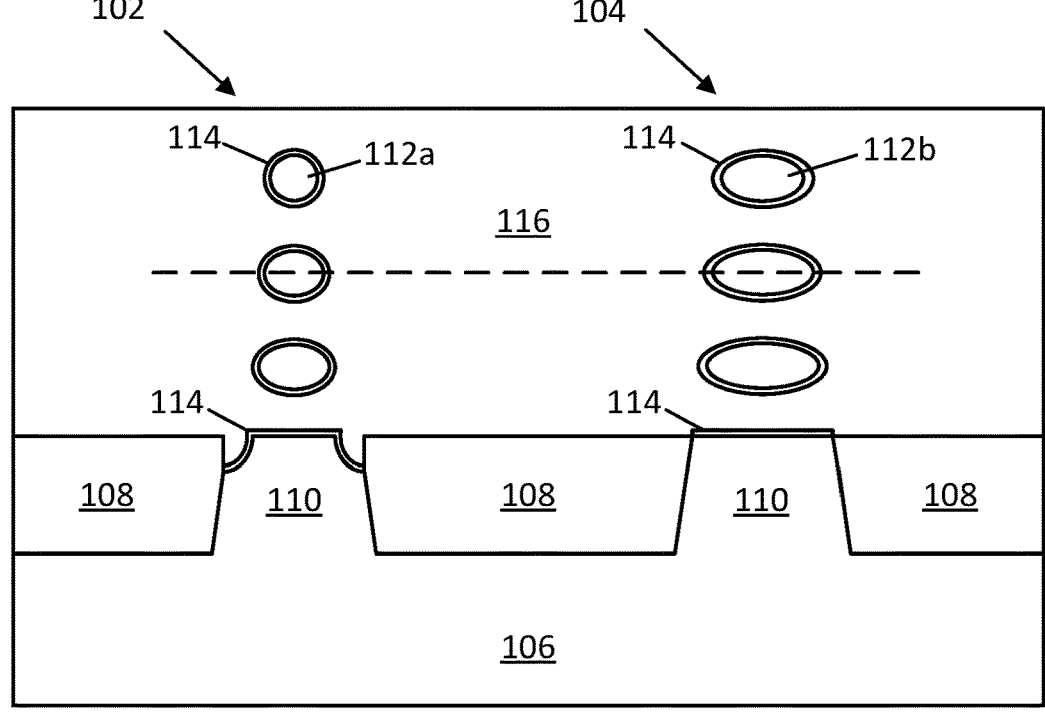

FIG. 1B illustrates an integrated circuit similar to that depicted in FIG. 1A, except that the various features are drawn to reflect real-world process conditions, according to an embodiment. For instance, while FIG. 1A generally indicates the various features using straight lines, right angles, and smooth surfaces, an actual integrated circuit structure configured in accordance with an embodiment of the present disclosure may have less than perfect straight lines and right angles, and some features may have a rough surface topography or otherwise be non-smooth, given real-world limitations of fabrication processes such as etching and depositing. As can be seen in FIG. 1B, subfins 110 may be tapered rather than rectangular, and nanoribbons 112a/112b are more rounded and blob-like. Note that the nanoribbons may taper as well, such that the uppermost nanoribbon is less wide that the lowermost nanoribbon, and the middle nanoribbon has a width that is between the width of the lowermost nanoribbon and the width of the uppermost nanoribbon. Further note that sidewalls of the right subfin may be collinear with the sidewalls of nanoribbons 112b (because there was no intentional thinning along that fin structure), and sidewalls of the left subfin are not collinear with the sidewalls of nanoribbons 112a (because of the intentional thinning of nanoribbons 112a). Additionally, the corners of the left subfin region 110 of semiconductor device 102 may show signs of being etched away (e.g., undercut etching), as will be discussed in more detail herein.

Fabrication Methodology

FIGS. 2A-2G include cross-sectional views that collectively illustrate an example process for forming an integrated circuit configured with semiconductor devices having narrower nanoribbons compared to other semiconductor devices on the same substrate, in accordance with an embodiment of the present disclosure. Each figure shows an example structure that results from the process flow up to that point in time, so the depicted structure evolves as the process flow continues, culminating in the structure shown in FIG. 2G, which is similar to the structure illustrated in FIG. 1A. The illustrated integrated circuit structure may be part of a larger integrated circuit that includes other integrated circuitry not depicted. Example materials and process parameters are given, but the present disclosure is not intended to be limited to any specific such materials or parameters, as will be appreciated.

Figure 2A:
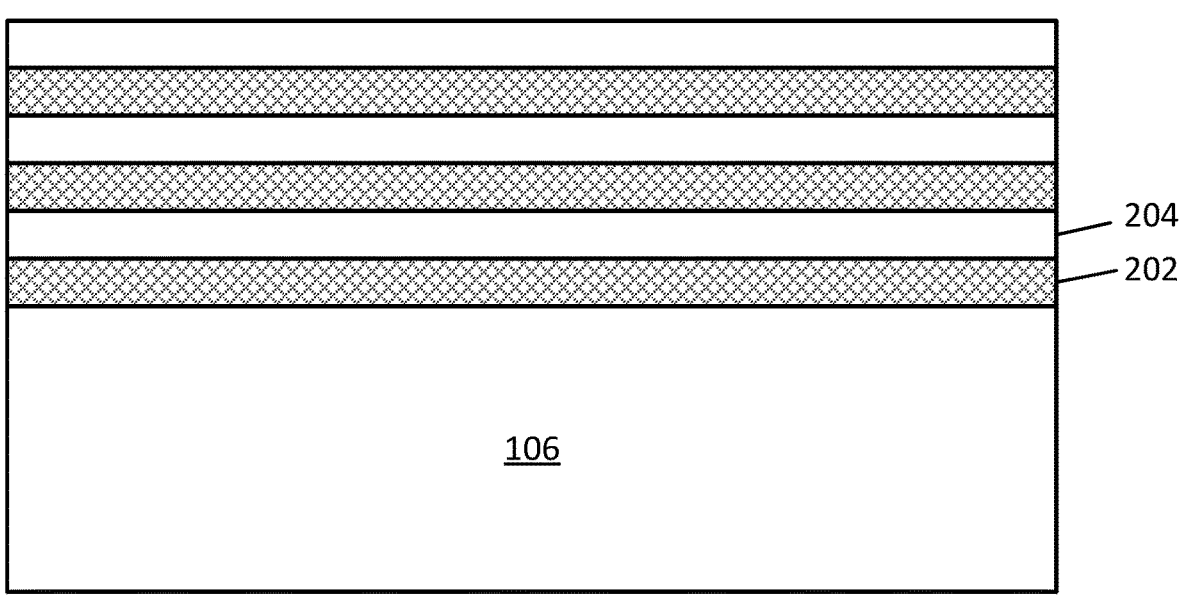
FIGS. 2A-2G are cross-sectional views that collectively illustrate an example process for forming semiconductor devices with thinned semiconductor regions, in accordance with an embodiment of the present disclosure.

FIG. 2A illustrates a cross-sectional view across a substrate having a series of material layers deposited over it, according to an embodiment of the present disclosure. The previous relevant discussion with respect to example configurations and materials for substrate 106 is equally applicable here. Alternating material layers may be deposited over substrate 106 that include sacrificial layers 202 alternating with semiconductor layers 204. Semiconductor layers 204 may include silicon, germanium, or a combination thereof. Sacrificial layers 202 have a different material composition than semiconductor layers 204. In some embodiments, sacrificial layers 202 include some combination of silicon and germanium. In other embodiments, sacrificial layers 202 include a higher germanium content compared to semiconductor layers 204. While dimensions can vary from one example embodiment to the next, the thickness of each semiconductor layer 204 and sacrificial layer 202 may be between about 5 nm and about 25 nm. Each of sacrificial layer 202 and semiconductor layer 204 may be deposited using any known material deposition technique, such as chemical vapor deposition (CVD), plasma-enhanced chemical vapor deposition (PECVD), physical vapor deposition (PVD), or atomic layer deposition (ALD).

Figure 2B:
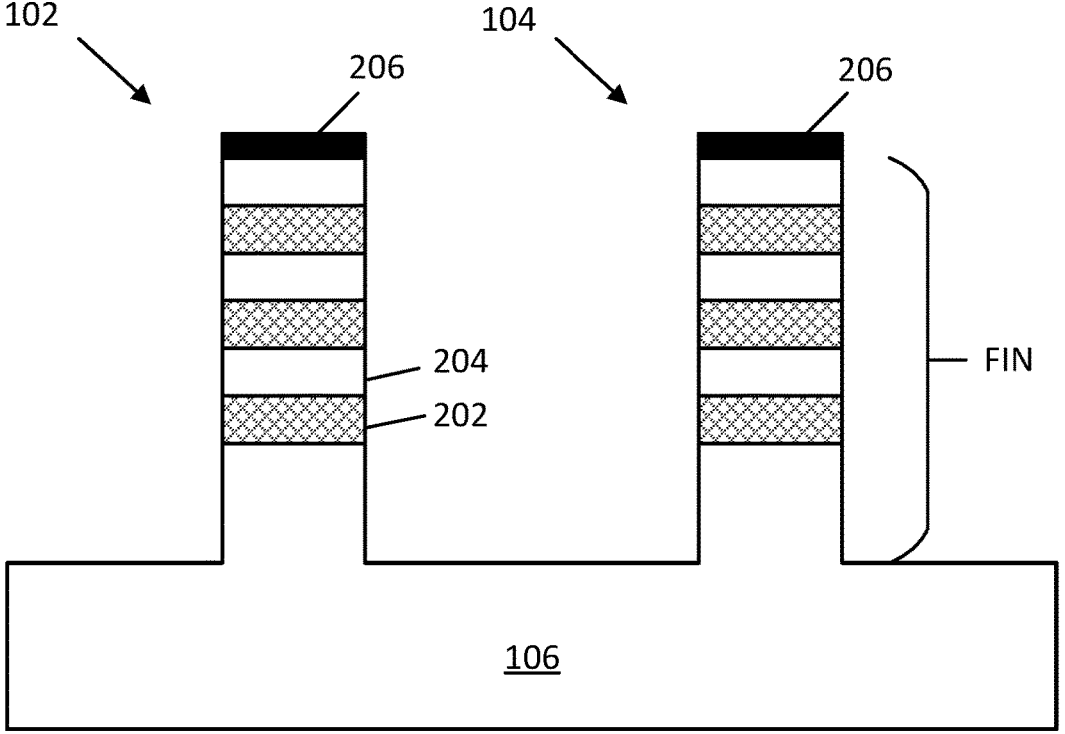

FIG. 2B illustrates a cross-sectional view of the structure shown in FIG. 2A following the formation of semiconductor fins, according to an embodiment of the present disclosure. Any number of fins can be patterned across the integrated circuit, but only two are illustrated here for clarity. Each of semiconductor device 102 and 104 includes a semiconductor fin. The fins can include at least a portion that is native to the substrate, as illustrated, or may be non-native to the substrate. Each of the illustrated fins includes a multilayer structure having alternating sacrificial layers 202 and semiconductor layers 204. In some embodiments, the fins are alternating with respect to transistor polarity. For instance, the fin of semiconductor device 102 can include a PMOS material fin (e.g., semiconductor layers 204 are doped with n-type dopants) and the fin of semiconductor device 104 can include an NMOS material fin (e.g., semiconductor layers 204 are doped with p-type dopants) for a first logic or memory cell. Numerous other configurations can be used, including fins included in integrated circuit sections other than memory or logic sections, such as analog mixed signal sections, input/output sections, radio frequency or transducer sections.

The fins may be formed by using a patterned hard mask layer or photoresist such as a cap layer 206. According to some embodiments, cap layer 206 protects the underlying material during a directional etching process, such as reactive ion etching (RIE). Cap layer may be, for example, a nitride, oxynitride, a carbide, or an oxycarbonitride. While dimensions can vary from one example embodiment to the next, the total height of the fins extending above the surface of substrate 106 may be in the range of about 100 nm to about 250 nm.

It should be noted that the fin fabrication process described with reference to FIGS. 2A and 2B is just one example process for forming multilayer fins. Other processes may be used as well, such as the aforementioned aspect ratio trapping based process.

Figure 2C:
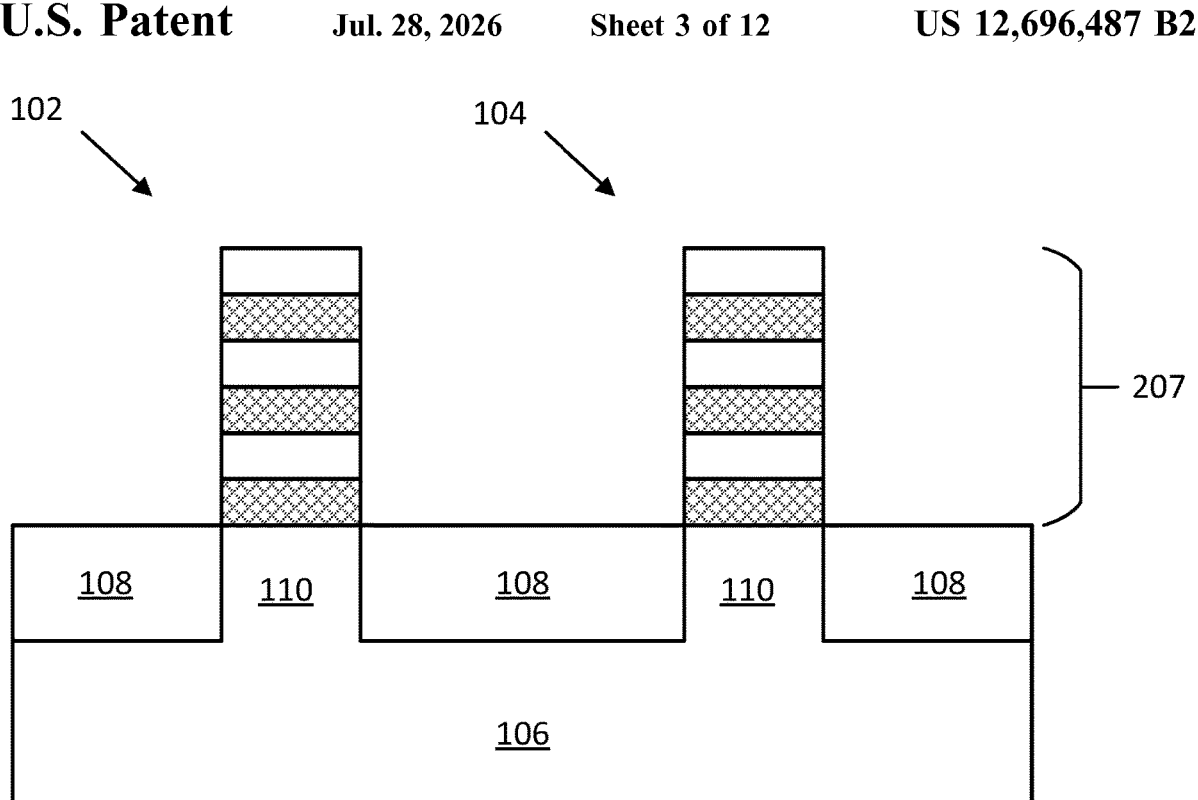

FIG. 2C illustrates a cross-sectional view of the structure shown in FIG. 2B following the formation of dielectric fill 108, according to an embodiment of the present disclosure. Dielectric fill 108 may act as shallow trench isolation (STI) between adjacent semiconductor devices. In some embodiments, dielectric fill 108 includes silicon oxide, although other oxides or dielectrics may be used as well. Dielectric fill 108 may first be deposited to at least the same height as the fins, and then recessed back using any known controlled etching process to the final height shown. According to some embodiments, each of the fins includes a subfin portion 110 beneath an exposed fin 207 and between dielectric fill 108. Subfin portion 110 may include the same material as semiconductor substrate 106 and may be an integral part of semiconductor substrate 106 that would extend below dielectric fill 108. Following the formation of dielectric fill 108, the exposed fin 207 extending above a top surface of dielectric layer 108 may have a height between about 50 nm and about 200 nm. The width of the fins can be, for example, in the range of about 5 to about 15 nm, such as 6 nm wide.

Figure 2D:
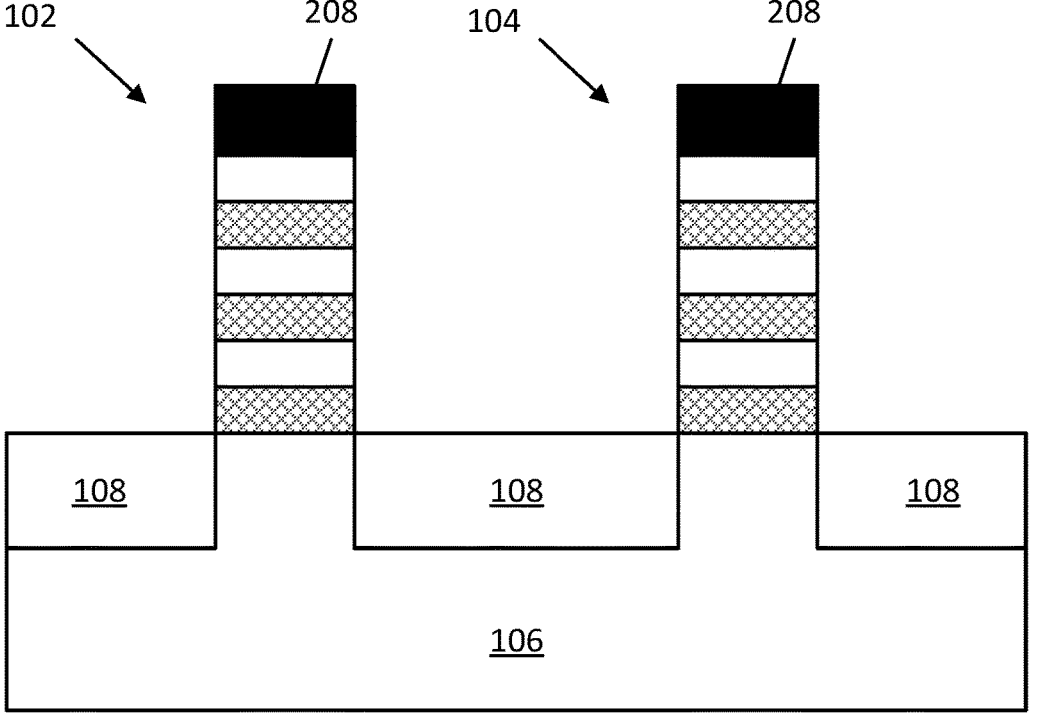

FIG. 2D illustrates a cross-sectional view of the structure shown in FIG. 2C following the formation of helmet structures 208 over the fins, according to an embodiment of the present disclosure. According to some embodiments, helmet structures 208 include a dielectric material and are deposited using a PVD process, such as sputtering, although other suitable deposition techniques can be used that can selectively deposit on the tops of the fins, such as CVD where reactant species is available at the top surface of the fins where growth is desired. In some embodiments, helmet structures 208 include a metal oxide to provide high etch selectivity with the underlying fin material(s). The PVD or other selective deposition technique is used to maximize the deposition of helmet structures 208 over the top surfaces of the fins, while minimizing deposition between the fins and along sidewalls of the fins. In some embodiments, helmet structures 208 have rounded edges, producing a curved top surface rather than the illustrated flat top surface, which may also manifest as curved sidewalls. Helmet structures 208 may be deposited to any desired thickness, so long as the deposition does not cause helmet structures 208 to deposit substantially along any portion of the sidewalls of the fins. In some example embodiments, helmet structures 208 have a thickness between about 5 nm and about 50 nm.

Figure 2E:
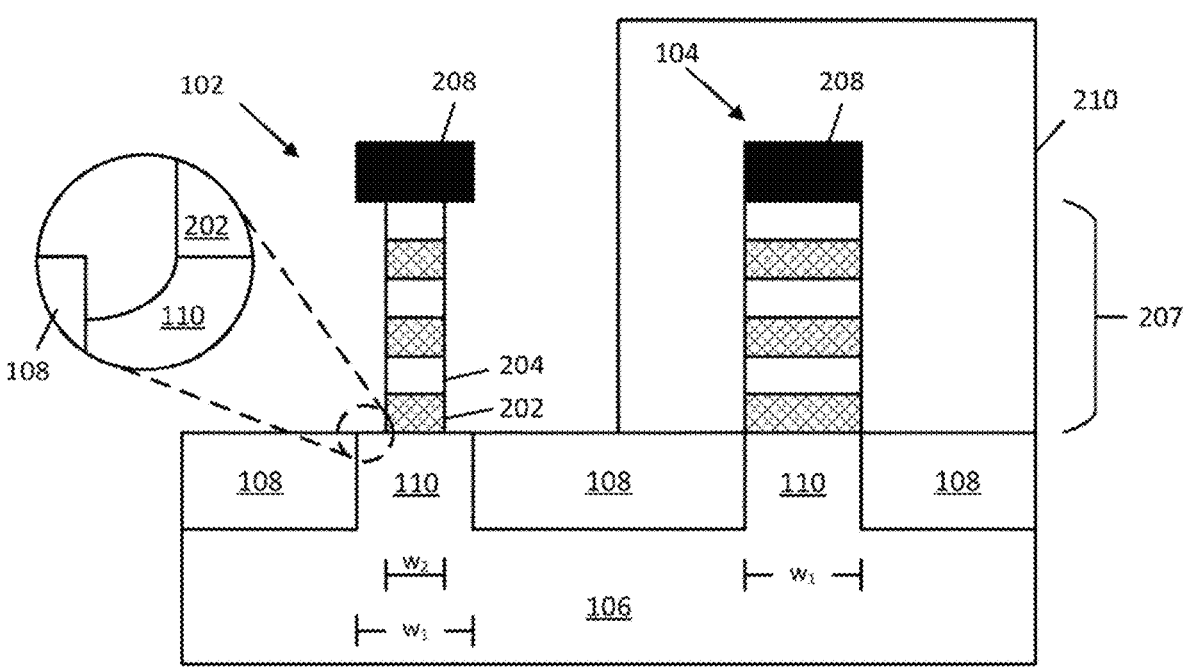

FIG. 2E illustrates a cross-sectional view of the structure shown in FIG. 2D following an etching process to trim the width of the fin of one of the semiconductor devices, according to an embodiment of the present disclosure. A masking material 210 is deposited and patterned to cover one or more of the fins, such as the fin of semiconductor device 104. In some embodiments, masking material 210 is patterned to cover one or more n-channel semiconductor devices while exposing one or more of the p-channel semiconductor devices. Masking material 210 may be a photoresist or hard mask material, such as a carbon hard mask.

According to some embodiments, a lateral etching process is performed on the exposed fins (such as exposed fin 207 of semiconductor device 102) to reduce the width of the alternating material layers in the fin. In one example, an isotropic wet or dry etching process provides a similar etch rate to both semiconductor layers 204 and sacrificial layers 202. Since the top surface of the fin is protected by helmet structure 208, the sides of the fin are laterally etched inwards while maintaining the thickness of the top material layer. In some embodiments, a final width $w_2$ of the laterally etched fin is at least 25% less, at least 50% less, at least 60% less, or at least 75% less than the width $w_1$ of the unetched fin. Similarly, the final width $w_2$ of the laterally etched fin may be at least 25% less, at least 50% less, at least 60% less, or at least 75% less than the width $w_1$ of the subfin 110 beneath the laterally etched fin. As noted above, width $w_1$ may be between about 5 nm and about 8 nm, and width $w_2$ may be between about 2 nm and about 4 nm.

In some embodiments, the isotropic etching process used to laterally etch both semiconductor layers 204 and sacrificial layers 202 may also etch one or more portions of subfin 110 beneath the laterally etched fin. This occurs as the lowest material layer in the exposed fin 207 of semiconductor device 102 is etched back to expose subfin 110 to the same etchants. If subfin 110 includes a similar material composition to that of semiconductor layers 204 or sacrificial layers 202, then a portion of it may be etched as well. This is illustrated in the blown-out portion focused on the corner of subfin 110 where the material around the corner has been removed to form an inwardly curved surface.

Figure 2F:
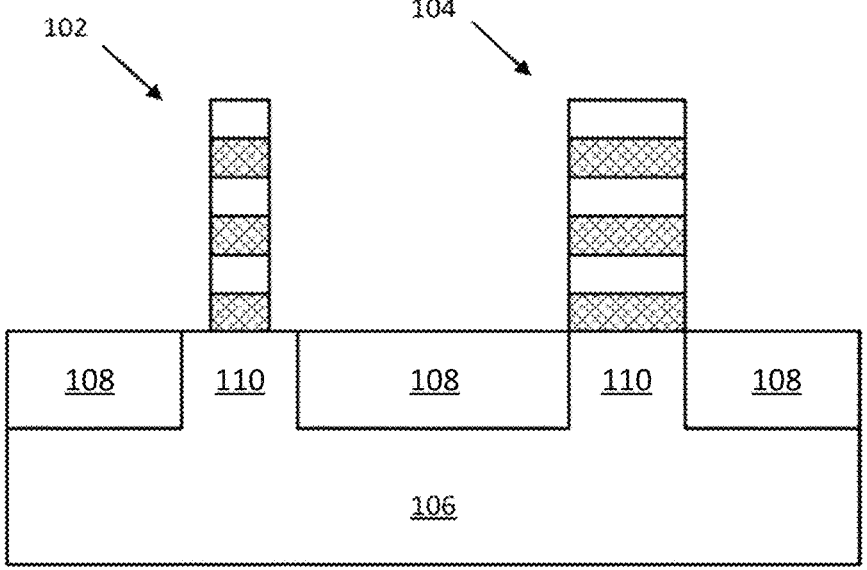

FIG. 2F illustrates a cross-sectional view of the structure shown in FIG. 2E following the removal of masking material 210 and helmet structures 208, according to an embodiment of the present disclosure. Masking material 210 may be removed using any standard ashing process. Helmet structures 208 may be removed using any wet or dry etching technique that selectivity etches the material of helmet structures 208 while providing minimal etching to the fins or to dielectric fill 108.

Figure 2G:
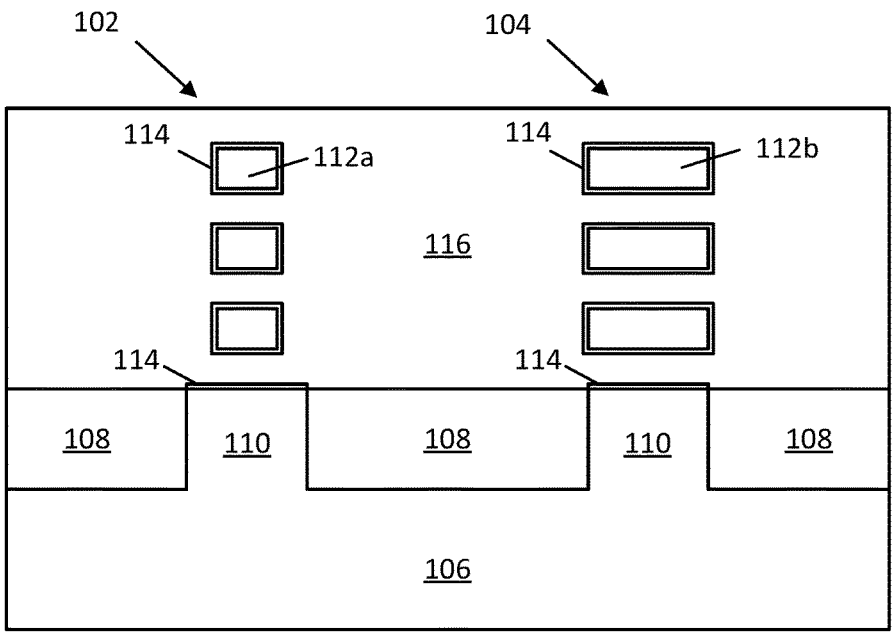

At this stage, subsequent processes are performed to form the remaining GAA transistor structures that ultimately yield the structure illustrated in FIG. 2G. Briefly, these remaining processes involve the formation of source and drain regions for each of semiconductor devices 102 and 104, the removal of sacrificial layers 202 to form suspended nanoribbons 112a/112b, the formation of gate dielectric 114 around the nanoribbons 112a/112b, and the formation of gate structure 116. The results of many of these processes cannot be seen in the illustrated cross-section and so are shown in FIGS. 3A-3H, which include plan views that collectively illustrate an example process for forming GAA transistor structures for semiconductor devices 102 and 104, in accordance with an embodiment of the present disclosure.

Figure 3A:
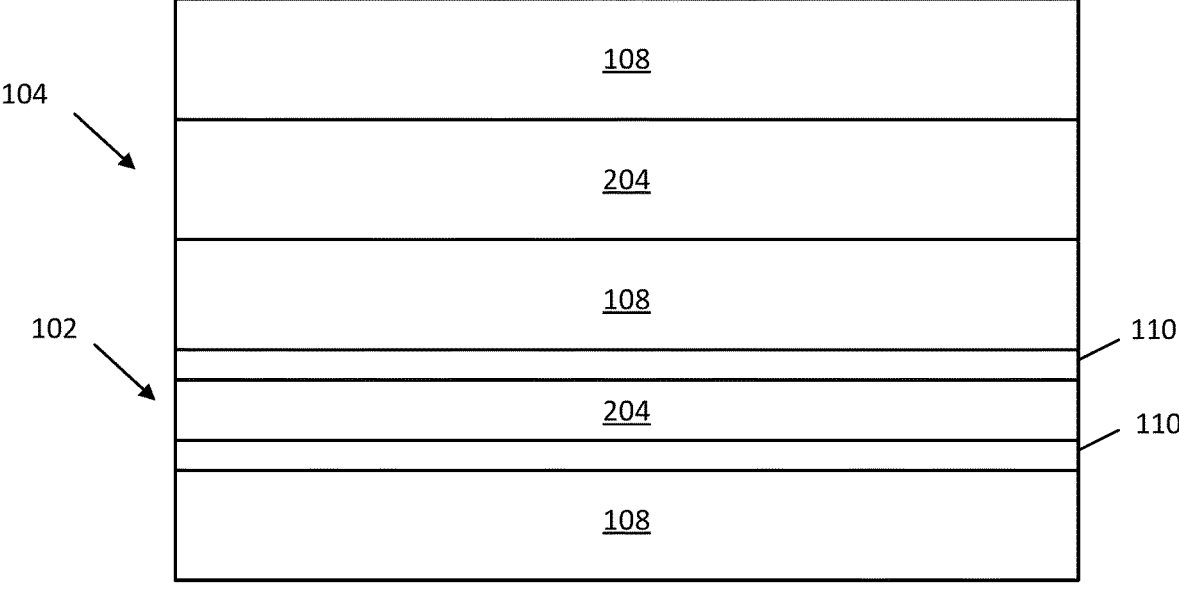
FIGS. 3A-3H are plan views that illustrate various stages in an example process for forming transistor structures for the semiconductor devices, in accordance with an embodiment of the present disclosure.

FIG. 3A illustrates a plan view of semiconductor devices 102 and 104 from FIG. 2F, in accordance with an embodiment of the present disclosure. Each of the fins run parallel to one another with the top semiconductor layer 204 visible on each fin. Note that the top layer of the material stack in any of the fins may also be sacrificial layer 202. Dielectric fill 108 is visible on either side of each of the fins. According to some embodiments, the fin of semiconductor device 102 is narrower than the fin of semiconductor device 104 due to the lateral etching process described with reference to FIG. 2E. Accordingly, portions of subfin 110 may be visible on either side of the fin of semiconductor device 102.

Figure 3B:
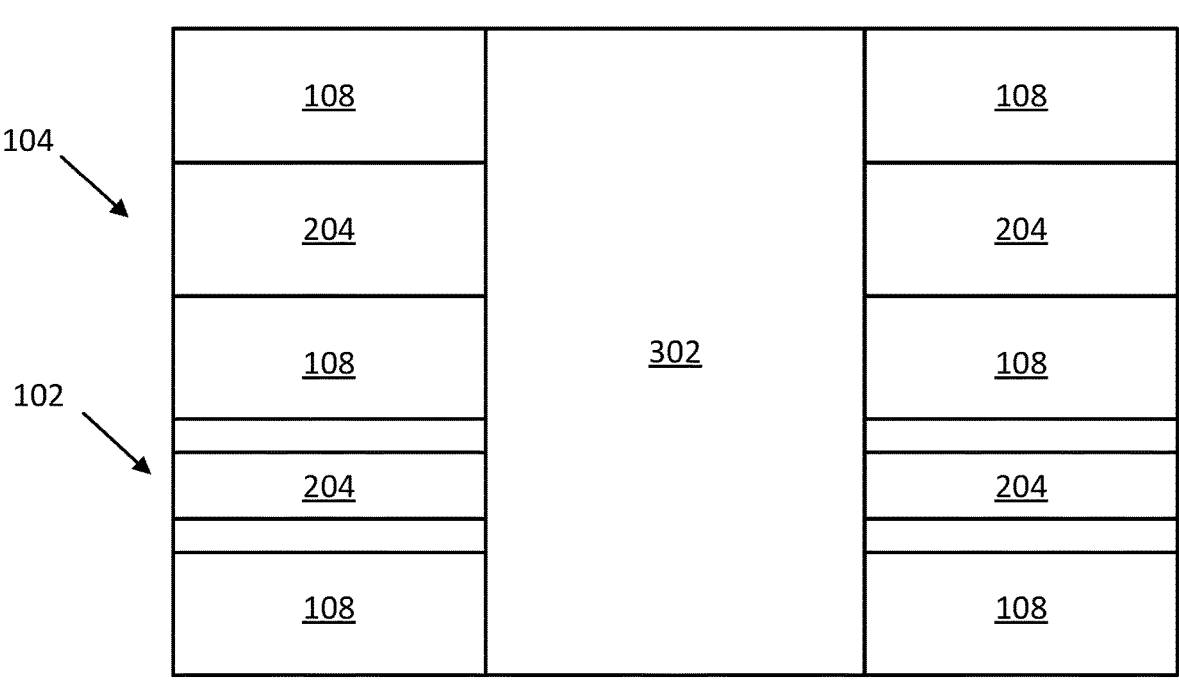

FIG. 3B illustrates a plan view of the structure shown in FIG. 3A following the deposition of a sacrificial gate 302, in accordance with an embodiment of the present disclosure. Sacrificial gate 302 may run in an orthogonal direction to each of the fins and may include any material that can be safely removed later in the process without etching or otherwise damaging any portions of the fins or of the sidewall spacers formed in the next step. In some embodiments, sacrificial gate 302 includes a cap layer (not shown) that is used to define the pattern of sacrificial gate 302 during a reactive ion etching (RIE) process. In some examples, the cap layer comprises silicon nitride while sacrificial gate 302 comprises polysilicon. The cap layer may be removed after patterning the locations for sacrificial gate 302.

Figure 3C:
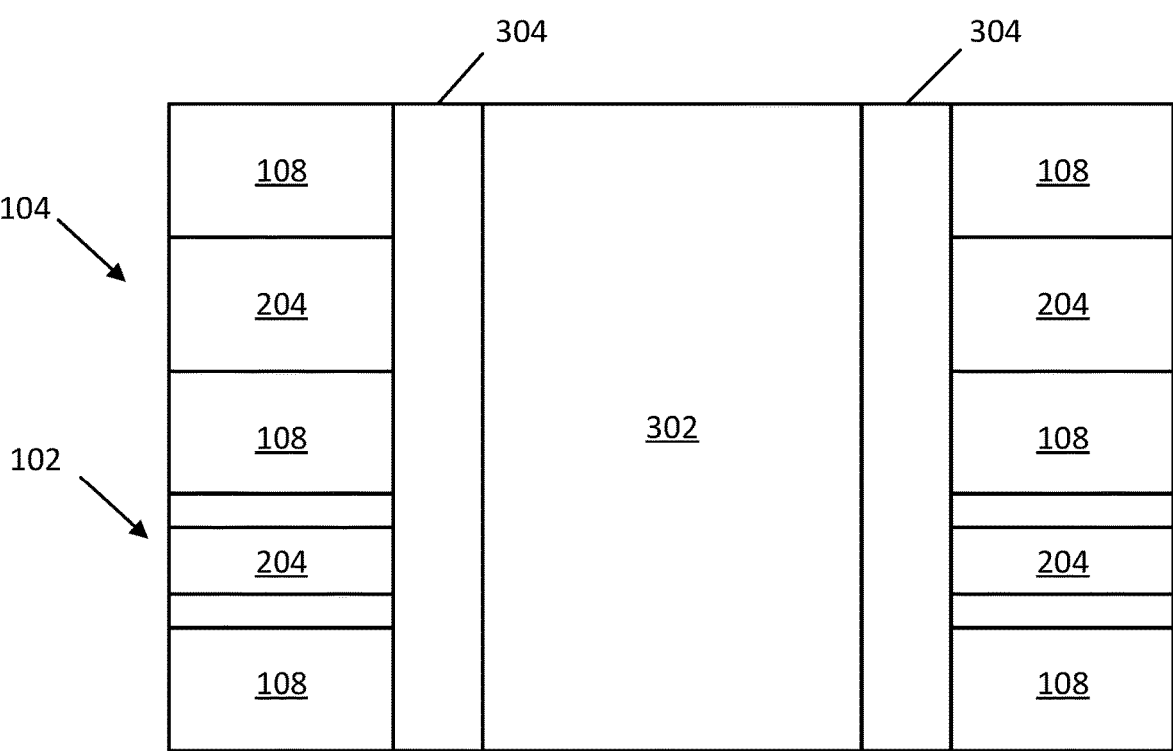

FIG. 3C illustrates a plan view of the structure shown in FIG. 3B following the formation of spacer structures 304 on either side of sacrificial gate 302, in accordance with an embodiment of the present disclosure. Spacer structures 304 may be formed using an etch-back process where spacer material is deposited everywhere and then anisotropically etched to leave the material only on sidewalls of structures. Spacer structures 304 may include a dielectric material, such as silicon nitride, silicon oxy-nitride, or any formulation of those layers incorporating carbon or boron dopants.

Figure 3D:
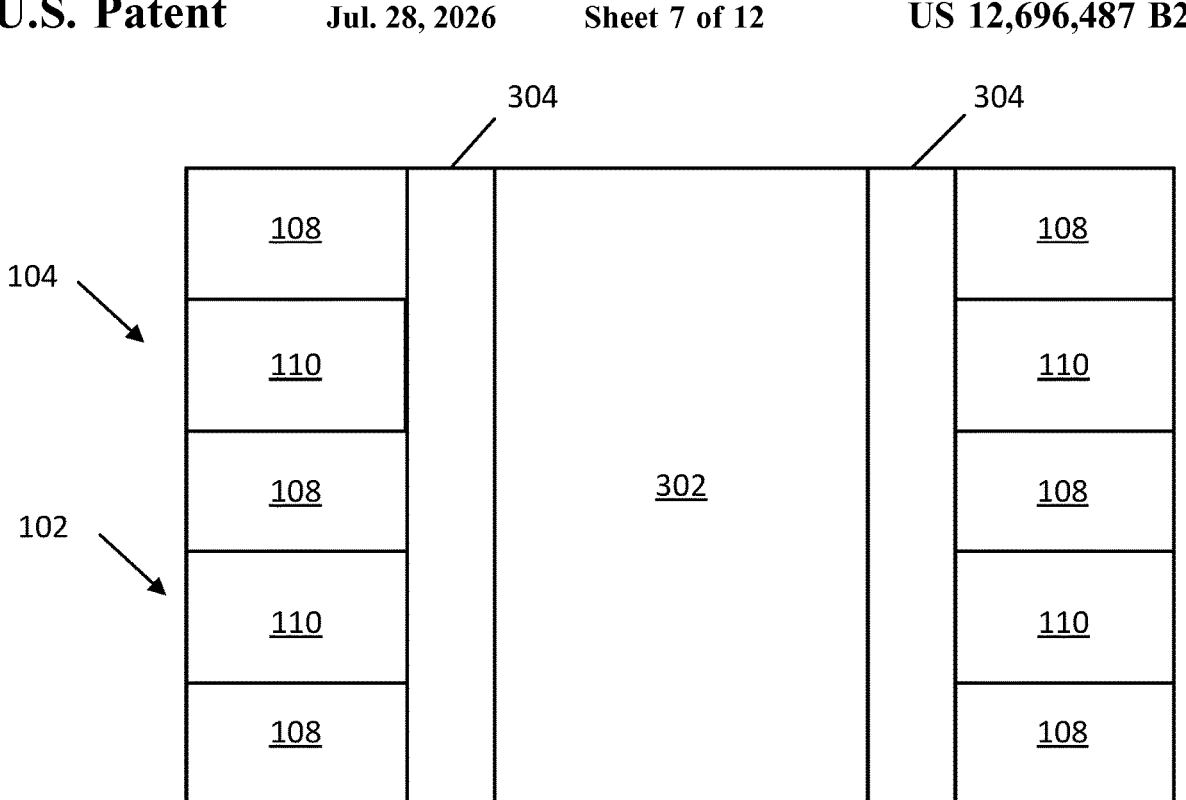

FIG. 3D illustrates a plan view of the structure shown in FIG. 3C following the removal of the exposed fin portions not covered by sacrificial gate 302 and spacer structures 304, in accordance with an embodiment of the present disclosure. The exposed fin portions may be removed using an RIE process to selectively etch through the semiconductor materials of both semiconductor layers 204 and sacrificial layers 202. According to some embodiments, the removal of the fins exposes a portion of (or all of) a top surface of subfin 110 for both semiconductor devices 102 and 104. It should be noted that the narrower fin of semiconductor device 102 still exists protected beneath sacrificial gate 302 and spacer structures 304.

Figure 3E:
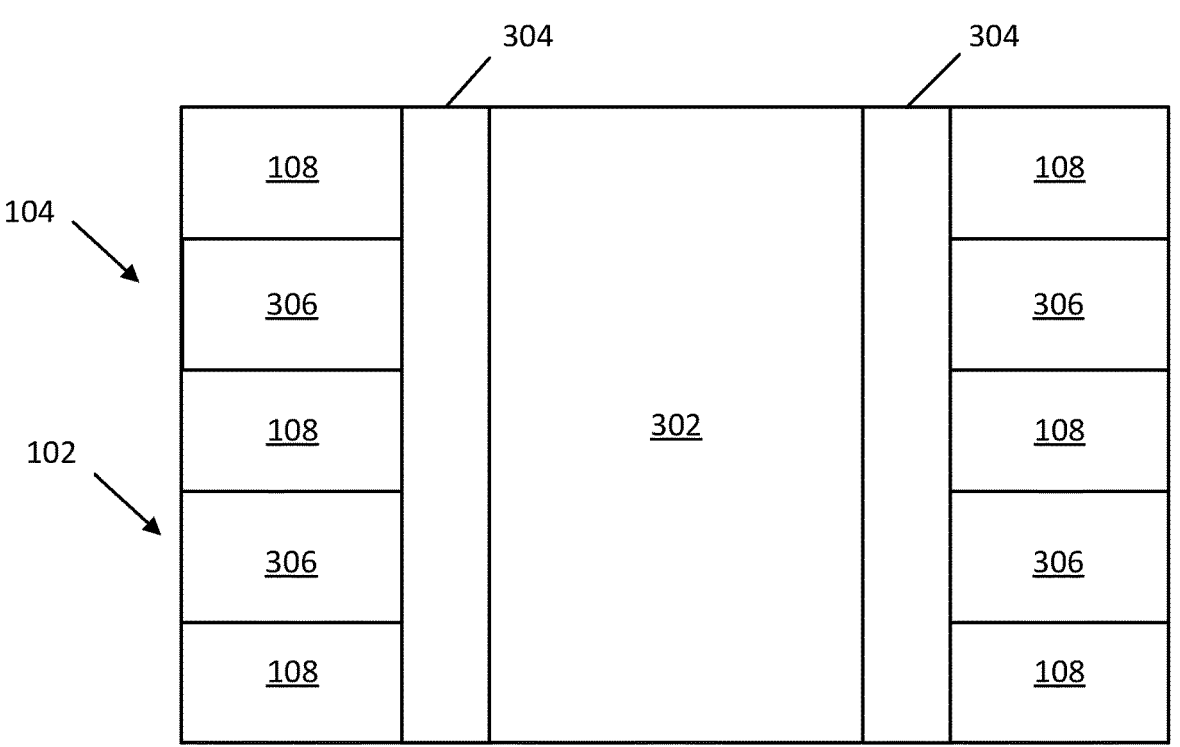

FIG. 3E illustrates a plan view of the structure shown in FIG. 3D following the formation of source or drain regions 306 for each of semiconductor device 102 and 104, in accordance with an embodiment of the present disclosure. In some examples, source or drain regions 306 are epitaxially grown over the exposed subfins 110. Any semiconductor materials suitable for source or drain regions 306 can be used (e.g., group IV and group III-V semiconductor materials). The source or drain regions 306 may include multiple layers such as liners and capping layers to improve contact resistance. In any such cases, the composition and doping of the source or drain regions 306 may be the same or different, depending on the polarity of the transistors. In one example, semiconductor device 102 is a p-type MOS (PMOS) transistor having source or drain regions 306 that include a high concentration of p-type dopants, and semiconductor device 104 is an n-type MOS (NMOS) transistor having source or drain regions 306 that include a high concentration of n-type dopants. Any number of source and drain configurations and materials can be used.

Figure 3F:
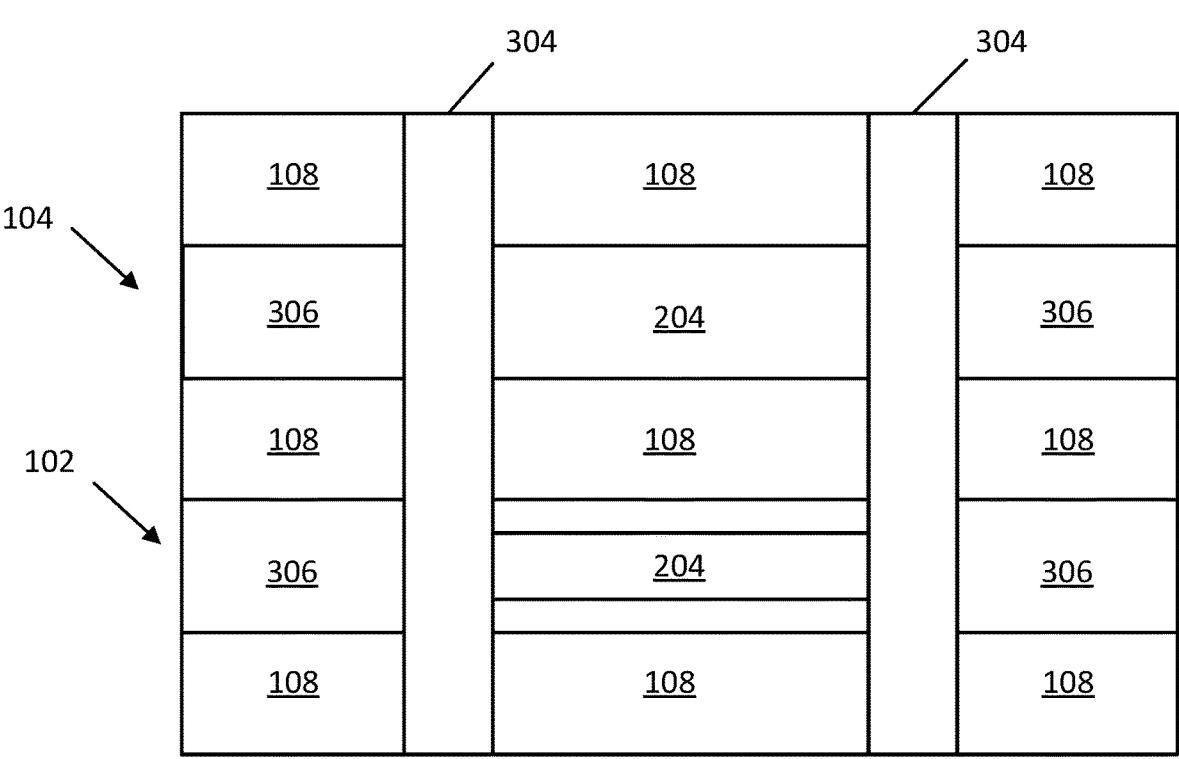

FIG. 3F illustrates a plan view of the structure shown in FIG. 3E following the removal of sacrificial gate 302, in accordance with an embodiment of the present disclosure. Sacrificial gate 302 may be removed using any wet or dry isotropic process thus exposing the portions of the fins that had been under sacrificial gate 302. The alternating layer stack of each of the fins would be exposed within the trench left behind after the removal of sacrificial gate 302. At this stage, although not seen in the figures, the sacrificial layers 202 within each of the fins would be removed using a selective isotropic etching process that removes the material of sacrificial layers 202 but does not remove (or removes very little of) the layers of semiconductor layers 204. At this point, the suspended semiconductor layers 204 form nanoribbons or nanowires that extend between source or drain regions 306 in each of semiconductor devices 102 and 104.

Figure 3G:
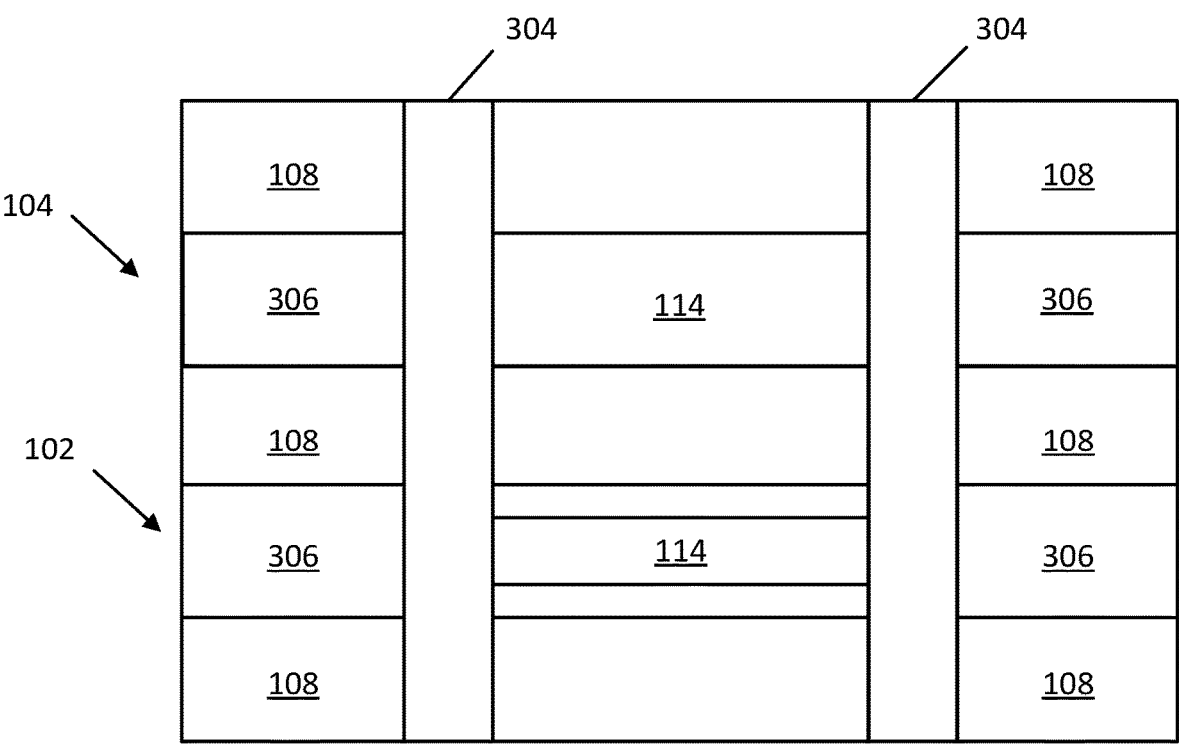

FIG. 3G illustrates a plan view of the structure shown in FIG. 3F following the formation of gate dielectric 114, in accordance with an embodiment of the present disclosure. Gate dielectric 114 may include any suitable dielectric (such as silicon dioxide, and/or a high-k dielectric material). Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. According to some embodiments, gate dielectric 114 is hafnium oxide with a thickness between about 1 nm and about 5 nm. In some embodiments, the gate dielectric 114 may include one or more silicates (e.g., titanium silicate, tungsten silicate, niobium silicate, and silicates of other transition metals). Gate dielectric 114 may be a multilayer structure, in some examples. For instance, gate dielectric 114 may include a first layer on semiconductor layers 204, and a second layer on the first layer. The first layer can be, for instance, an oxide of semiconductor layers 204 (e.g., silicon dioxide) and the second layer can be a high-k dielectric material (e.g., hafnium oxide). In some embodiments, an annealing process may be carried out on gate dielectric 114 to improve its quality when a high-k dielectric material is used. In some embodiments, the high-K material can be nitridized to improve its aging resistance.

In the illustrated example, gate dielectric 114 is shown on semiconductor layers 204, but it may also be present along the inner sidewalls of spacer structures 304 and along the top surface of fill dielectric 108. Further, gate dielectric 114 may be formed over any exposed portions of subfin 110 of semiconductor device 102 and/or semiconductor device 104.

Figure 3H:
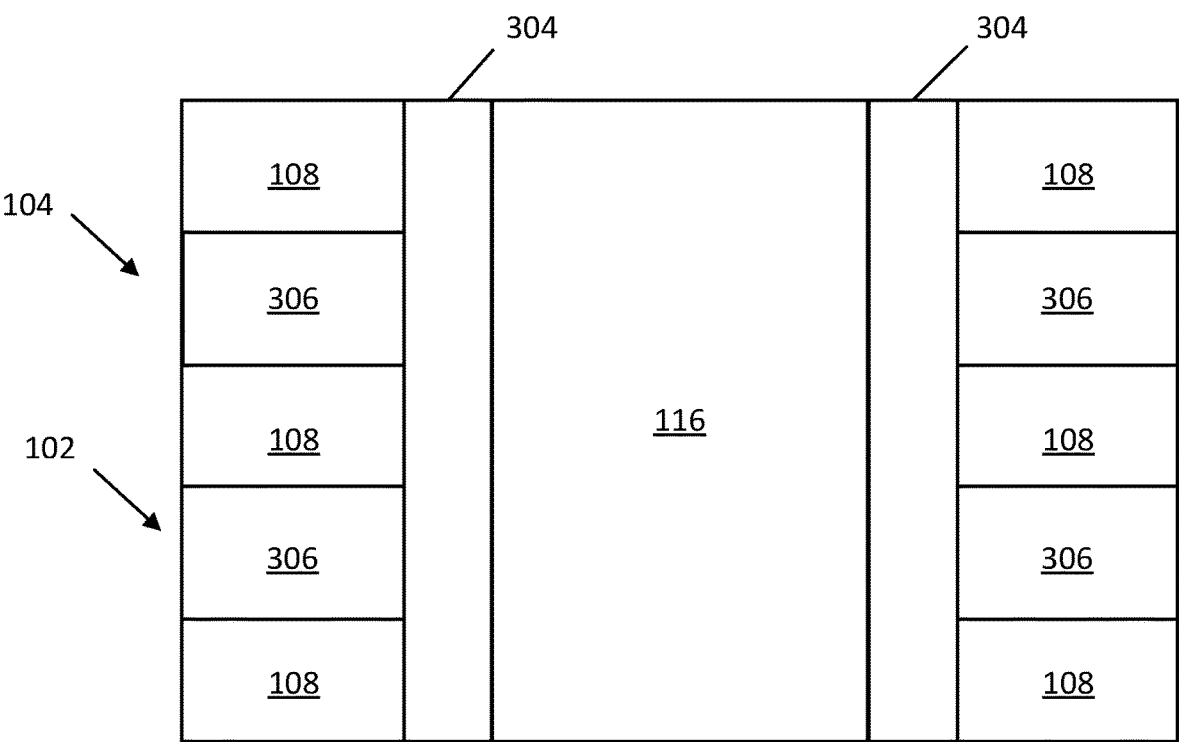

FIG. 3H illustrates a plan view of the structure shown in FIG. 3G following the formation of gate structure 116 within the trench between spacer structures 304, in accordance with an embodiment of the present disclosure. Gate structure 116 can be any standard or proprietary gate structure and may include any number of gate cuts. In some embodiments, gate structure 116 includes doped polysilicon, a metal, or a metal alloy. Example suitable metals or metal alloys include aluminum, tungsten, cobalt, molybdenum, ruthenium, titanium, tantalum, copper, and carbides and nitrides thereof. Gate structure 116 may include, for instance, one or more workfunction layers, resistance-reducing layers, and/or barrier layers. The workfunction layers can include, for example, p-type workfunction materials (e.g., titanium nitride) for PMOS gates, or n-type workfunction materials (e.g., titanium aluminum carbide) for NMOS gates.

Figure 4:
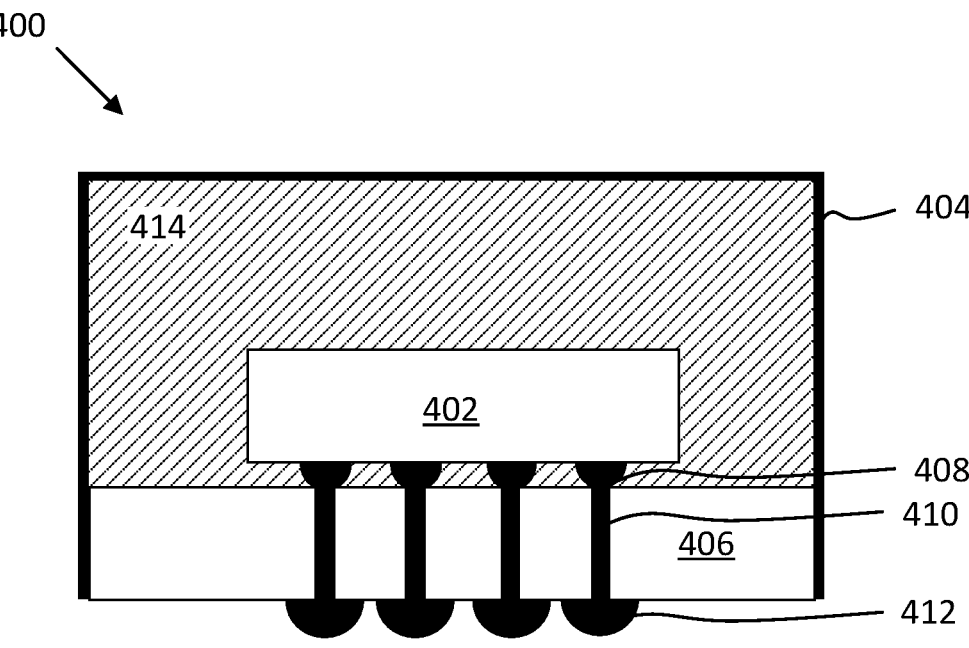
FIG. 4 illustrates a cross-section view of a chip package containing one or more semiconductor dies, in accordance with some embodiments of the present disclosure.

FIG. 4 illustrates an example embodiment of a chip package 400, in accordance with an embodiment of the present disclosure. As can be seen, chip package 400 includes one or more dies 402. One or more dies 402 may include at least one integrated circuit having semiconductor devices, such as any of the semiconductor devices disclosed herein. One or more dies 402 may include any other circuitry used to interface with other devices formed on the dies, or other devices connected to chip package 400, in some example configurations.

As can be further seen, chip package 400 includes a housing 404 that is bonded to a package substrate 406. The housing 404 may be any standard or proprietary housing, and may provide, for example, electromagnetic shielding and environmental protection for the components of chip package 400. The one or more dies 402 may be conductively coupled to a package substrate 406 using connections 408, which may be implemented with any number of standard or proprietary connection mechanisms, such as solder bumps, ball grid array (BGA), pins, or wire bonds, to name a few examples. Package substrate 406 may be any standard or proprietary package substrate, but in some cases includes a dielectric material having conductive pathways (e.g., including conductive vias and lines) extending through the dielectric material between the faces of package substrate 406, or between different locations on each face. In some embodiments, package substrate 406 may have a thickness less than 1 millimeter (e.g., between 0.1 millimeters and 0.5 millimeters), although any number of package geometries can be used. Additional conductive contacts 412 may be disposed at an opposite face of package substrate 406 for conductively contacting, for instance, a printed circuit board (PCB). One or more vias 410 extend through a thickness of package substrate 406 to provide conductive pathways between one or more of connections 408 to one or more of contacts 412. Vias 410 are illustrated as single straight columns through package substrate 406 for ease of illustration, although other configurations can be used (e.g., damascene, dual damascene, through-silicon via, or an interconnect structure that meanders through the thickness of substrate 406 to contact one or more intermediate locations therein). In still other embodiments, vias 410 are fabricated by multiple smaller stacked vias, or are staggered at different locations across package substrate 406. In the illustrated embodiment, contacts 412 are solder balls (e.g., for bump-based connections or a ball grid array arrangement), but any suitable package bonding mechanism may be used (e.g., pins in a pin grid array arrangement or lands in a land grid array arrangement). In some embodiments, a solder resist is disposed between contacts 412, to inhibit shorting.

In some embodiments, a mold material 414 may be disposed around the one or more dies 402 included within housing 404 (e.g., between dies 402 and package substrate 406 as an underfill material, as well as between dies 402 and housing 404 as an overfill material). Although the dimensions and qualities of the mold material 414 can vary from one embodiment to the next, in some embodiments, a thickness of mold material 414 is less than 1 millimeter. Example materials that may be used for mold material 414 include epoxy mold materials, as suitable. In some cases, the mold material 414 is thermally conductive, in addition to being electrically insulating.

Methodology

Figure 5:
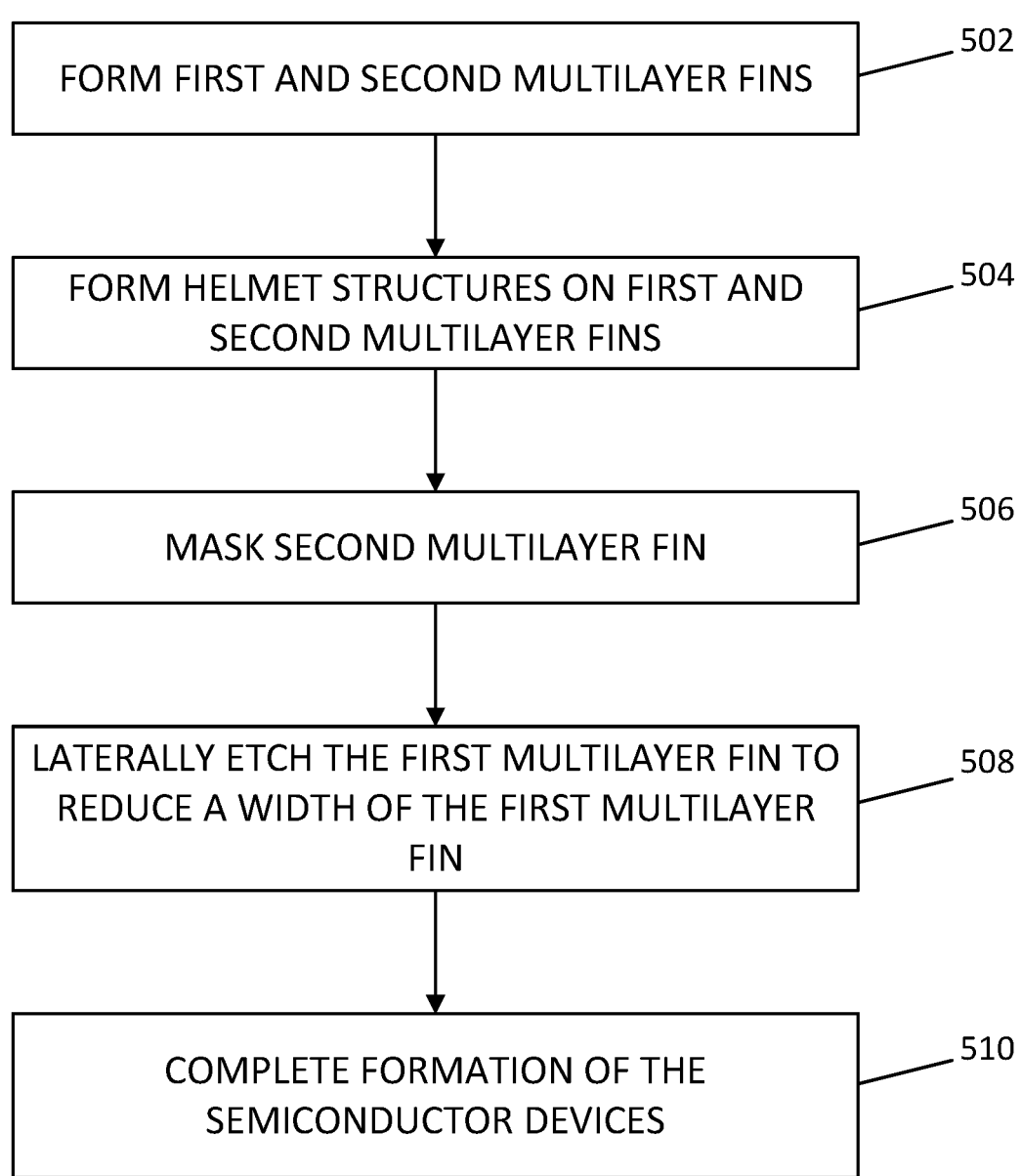
FIG. 5 is a flowchart of a fabrication process for semiconductor devices with thinned semiconductor regions, in accordance with an embodiment of the present disclosure.

FIG. 5 is a flow chart of a method 500 for forming at least a portion of an integrated circuit, according to an embodiment. Various operations of method 500 may be illustrated in FIGS. 2A-2G. However, the correlation of the various operations of method 500 to the specific components illustrated in the aforementioned figures is not intended to imply any structural and/or use limitations. Rather, the aforementioned figures provide one example embodiment of method 500. Other operations may be performed before, during, or after any of the operations of method 500. For example, method 500 does not explicitly describe many steps that are performed to form common transistor structures. Some of the operations of method 500 may be performed in a different order than the illustrated order.

Method 500 begins with operation 502 where at least first and second multilayer fins are formed. The multilayer fins may include alternating layers of sacrificial layers and semiconductor layers over a substrate. the thickness of each of the semiconductor layers and sacrificial layers may be between about 5 nm and about 25 nm. Each of the sacrificial layers and semiconductor layers may be deposited using any known material deposition technique, such as CVD, PECVD, PVD, or ALD. Once the material layers have been deposited, the fins may be defined via an anisotropic etching process, such as RIE, using a patterned mask material to protect the fins from the etch. The fin height may include the alternating material layers and a subfin portion formed from the substrate material. While dimensions can vary from one example embodiment to the next, the total height of the fins extending above the surface of the substrate may be in the range of about 100 nm to about 250 nm. The width of the fins can be, for example, in the range of about 5 to about 15 nm, such as 6 nm wide.

Method 500 continues with operation 504 where helmet structures are formed over the first and second fins. The helmet structures can include a dielectric material (such as silicon nitride) and may be deposited using a PVD process, such as sputtering, although other suitable deposition techniques can be used that can selectively deposit material on the tops of the fins, such as CVD where reactant species are available at the top surface of the fins where growth is desired. In some embodiments, the helmet structures include a metal oxide to provide high etch selectivity with the underlying fin material(s). In some embodiments, the helmet structures have rounded edges, producing a curved top surface rather than the illustrated flat top surface, which may also manifest as curved sidewalls. In some example embodiments, the helmet structures have a thickness between about 5 nm and about 50 nm.

Method 500 continues with operation 506 where the second fin is masked using a masking layer, while exposing the first fin. The masking layer may be patterned to cover one or more n-channel semiconductor devices while exposing one or more of the p-channel semiconductor devices. Accordingly, in this example, the first fin may include semiconductor material with n-type dopants and the second fin may include semiconductor material with p-type dopants. The masking layer may be a photoresist or hard mask material, such as a carbon hard mask.

Method 500 continues with operation 508 where the exposed first fin is laterally etched to reduce a width of the first fin. In one example, an isotropic wet or dry etching process provides a similar etch rate to each of the alternating material layers in the first fin. Since the top surface of the fin is protected by the helmet structure, the sides of the fin are laterally etched inwards while maintaining the thickness of the top material layer. In some embodiments, a final width of the laterally etched first fin is at least 25% less, at least 50% less, at least 60% less, or at least 75% less than the width of the second fin protected by the masking layer. In some embodiments, the width of the second fin may be between about 5 nm and about 8 nm, and the width of the first fin be between about 2 nm and about 4 nm. In some embodiments, the isotropic etching process used to laterally etch the first fin may also etch one or more portions of the subfin beneath the laterally etched first fin.

Method 500 continues with operation 510 where remaining transistor structures are formed to complete the formation of first and second semiconductor devices from the first and second fins, respectively. These remaining processes involve the formation of source and drain regions for each of the semiconductor devices, the removal of sacrificial material layers within each of the fins to form suspended semiconductor nanoribbons, the formation of a gate dielectric around the nanoribbons, and the formation of a gate structure or gate structures around the nanoribbons. The results of many of these processes are shown in FIGS. 3A-3H, which include plan views that collectively illustrate an example process for forming GAA transistor structures for two semiconductor devices 102 and 104.

Example System

Figure 6:
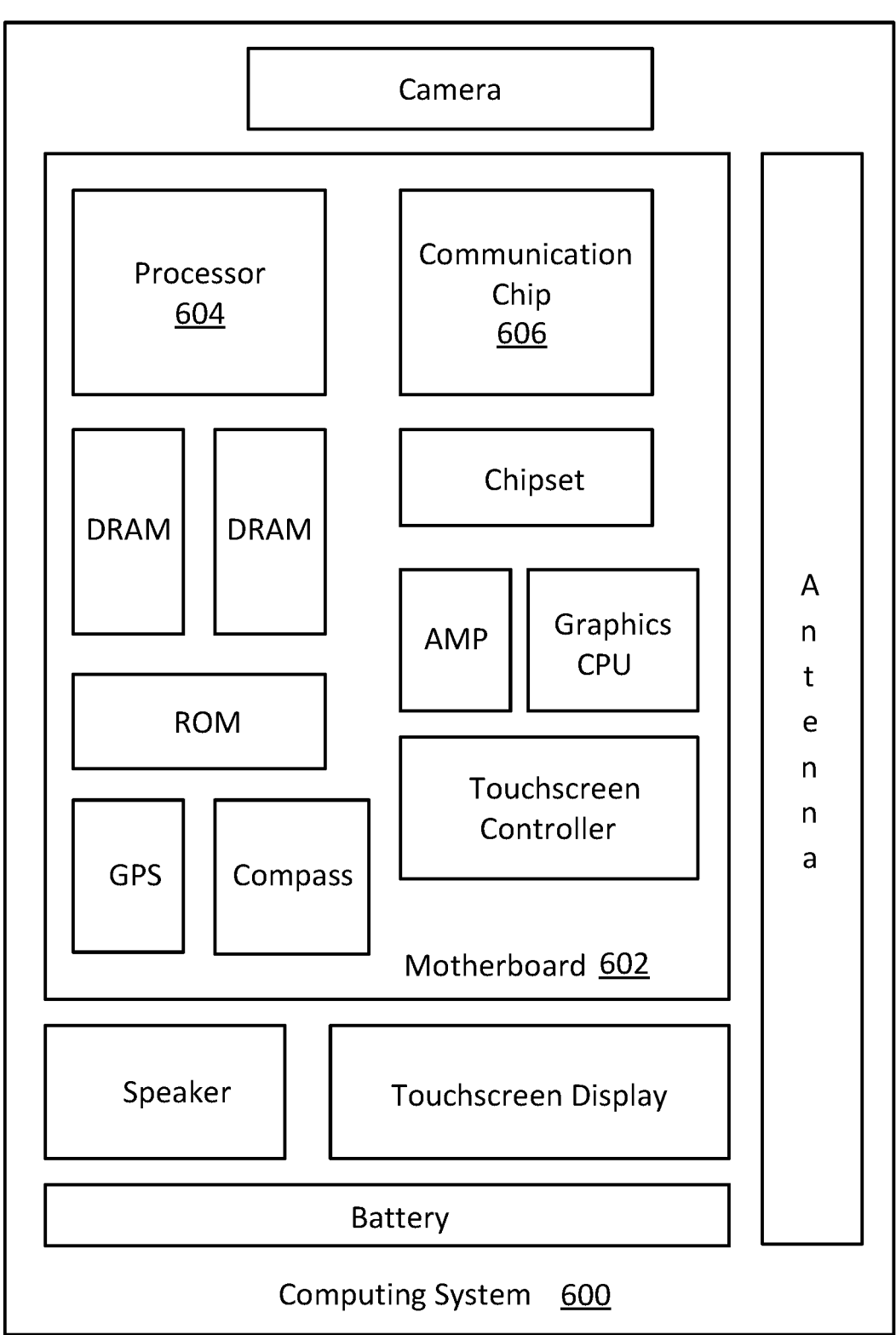
FIG. 6 illustrates a computing system including one or more integrated circuits, as variously described herein, in accordance with an embodiment of the present disclosure.

FIG. 6 is an example computing system implemented with one or more of the integrated circuit structures as disclosed herein, in accordance with some embodiments of the present disclosure. As can be seen, the computing system 600 houses a motherboard 602. The motherboard 602 may include a number of components, including, but not limited to, a processor 604 and at least one communication chip 606, each of which can be physically and electrically coupled to the motherboard 602, or otherwise integrated therein. As will be appreciated, the motherboard 602 may be, for example, any printed circuit board (PCB), whether a main board, a daughterboard mounted on a main board, or the only board of system 600, etc.

Depending on its applications, computing system 600 may include one or more other components that may or may not be physically and electrically coupled to the motherboard 602. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 600 may include one or more integrated circuit structures or devices configured in accordance with an example embodiment (e.g., a module including an integrated circuit device on a substrate, the substrate having one or more first semiconductor devices with nanoribbons having a first width and one or more second semiconductor devices with nanoribbons having a second width smaller than the first width, as variously provided herein). In some embodiments, multiple functions can be integrated into one or more chips (e.g., for instance, note that the communication chip 606 can be part of or otherwise integrated into the processor 604).

The communication chip 606 enables wireless communications for the transfer of data to and from the computing system 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing system 600 includes an integrated circuit die packaged within the processor 604. In some embodiments, the integrated circuit die of the processor includes onboard circuitry that is implemented with one or more semiconductor devices as variously described herein. The term "processor" may refer to any device or portion of a device that processes, for instance, electronic data from registers and/or memory to transform that electronic data into other electronic data that may be stored in registers and/or memory.

The communication chip 606 also may include an integrated circuit die packaged within the communication chip 606. In accordance with some such example embodiments, the integrated circuit die of the communication chip includes one or more semiconductor devices as variously described herein. As will be appreciated in light of this disclosure, note that multi-standard wireless capability may be integrated directly into the processor 604 (e.g., where functionality of any chips 606 is integrated into processor 604, rather than having separate communication chips). Further note that processor 604 may be a chip set having such wireless capability. In short, any number of processor 604 and/or communication chips 606 can be used. Likewise, any one chip or chip set can have multiple functions integrated therein.

In various implementations, the computing system 600 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

It will be appreciated that in some embodiments, the various components of the computing system 600 may be combined or integrated in a system-on-a-chip (SoC) architecture. In some embodiments, the components may be hardware components, firmware components, software components or any suitable combination of hardware, firmware or software.

Further Example Embodiments

The following examples pertain to further embodiments, from which numerous permutations and configurations will be apparent.

Example 1 is an integrated circuit that includes a first semiconductor device having a first semiconductor nanoribbon extending between a first source region and a first drain region and a second semiconductor device having a second semiconductor nanoribbon extending between a second source region and a second drain region. The first semiconductor nanoribbon has a first length and a first width, and the second semiconductor nanoribbon has a second length and a second width that is less than the first width. The semiconductor nanoribbon length corresponds to a first distance between the corresponding source and drain regions. The semiconductor nanoribbon width corresponds to a second distance between sidewalls of the corresponding nanoribbon. The second distance extends in a horizontal direction that is orthogonal to a horizontal direction in which the first distance extends.

Example 2 includes the subject matter of Example 1, wherein the first semiconductor device includes a first subfin beneath the first semiconductor nanoribbon and the second semiconductor device includes a second subfin beneath the second semiconductor nanoribbon, wherein both the first subfin and the second subfin have the first width.

Example 3 includes the subject matter of Example 1 or 2, wherein the first semiconductor device includes a first subfin beneath the first semiconductor nanoribbon and the second semiconductor device includes a second subfin beneath the second semiconductor nanoribbon, and wherein the first and second subfins each includes a tapered profile, and wherein sidewalls of the first subfin are collinear with the sidewalls of the first semiconductor nanoribbon, and sidewalls of the second subfin are not collinear with the sidewalls of the second semiconductor nanoribbon.

Example 4 includes the subject matter of any one of Examples 1-3, wherein the first semiconductor device includes a first subfin beneath the first semiconductor nanoribbon and the second semiconductor device includes a second subfin beneath the second semiconductor nanoribbon, and wherein upper edges of the second subfin are tapered or angled more than upper edges of the first subfin.

Example 5 includes the subject matter of any one of Examples 1-4, wherein the first semiconductor device is an n-channel device and the second semiconductor device is a p-channel device.

Example 6 includes the subject matter of any one of Examples 1-5, wherein the second width is at least 50% less than the first width.

Example 7 includes the subject matter of any one of Examples 1-6, wherein the first semiconductor nanoribbon and the second semiconductor nanoribbon comprise germanium, silicon, or a combination thereof.

Example 8 includes the subject matter of any one of Examples 1-7, wherein an imaginary horizontal plane at least partially passes through each of the first and second semiconductor nanoribbons.

Example 9 is a printed circuit board comprising the integrated circuit of any one of Examples 1-8.

Example 10 is an electronic device that includes a chip package comprising one or more dies. At least one of the one or more dies includes a first semiconductor device having a first body of semiconductor material extending between a first source region and a first drain region and having a first subfin beneath the first body of semiconductor material, and a second semiconductor device having a second body of semiconductor material extending between a second source region and a second drain region and having a second subfin beneath the second body of semiconductor material. The first body of semiconductor material has a first width that is substantially the same as a width of the first subfin, and the second body of semiconductor material has a second width that is less than a width of the second subfin and less than the first width.

Example 11 includes the subject matter of Example 10, wherein both the first subfin and the second subfin have substantially the same width.

Example 12 includes the subject matter of Example 10 or 11, wherein the first and second subfins each includes a tapered profile, and wherein sidewalls of the first subfin are collinear with the sidewalls of the first body of semiconductor material, and sidewalls of the second subfin are not collinear with the sidewalls of the second body of semiconductor material.

Example 13 includes the subject matter of any one of Examples 10-12, wherein upper edges of the second subfin are tapered or angled more than upper edges of the first subfin.

Example 14 includes the subject matter of any one of Examples 10-13, wherein the first semiconductor device is an n-channel device and the second semiconductor device is a p-channel device.

Example 15 includes the subject matter of any one of Examples 10-14, wherein the second width is at least 50% less than the first width.

Example 16 includes the subject matter of any one of Examples 10-15, wherein the first body of semiconductor material and the second body of semiconductor material comprise germanium, silicon, or a combination thereof.

Example 17 includes the subject matter of any one of Examples 10-16, wherein an imaginary horizontal plane at least partially passes through each of the first and second bodies of semiconductor material.

Example 18 includes the subject matter of any one of Examples 10-17, further comprising a printed circuit board, wherein the chip package is attached to the printed circuit board.

Example 19 is a method of forming an integrated circuit. The method includes forming a first multilayer fin and a second multilayer fin, each of the first and second multilayer fins comprising first and second material layers, wherein the second material layers comprise a semiconductor material suitable for use as a nanoribbon channel; forming a helmet structure on a top surface of the first multilayer fin and the second multilayer fin; masking the second multilayer fin while leaving the first multilayer fin exposed; and performing a lateral etching process on sidewalls of the first multilayer fin to reduce a width of the first multilayer fin.

Example 20 includes the subject matter of Example 19, wherein forming the first multilayer fin and the second multilayer fin comprises recessing a dielectric layer between the first and the second multilayer fins such that the first and the second multilayer fins extend above a top surface of the dielectric layer.

Example 21 includes the subject matter of Example 20, wherein a first semiconductor subfin is below the first multilayer fin and in the dielectric layer and a second semiconductor subfin is below the second multilayer fin and in the dielectric layer, and wherein the lateral etching process further etches a portion of the first semiconductor subfin.

Example 22 includes the subject matter of any one of Examples 19-21, wherein forming the helmet structure comprises forming the helmet structure via a sputtering process.

Example 23 includes the subject matter of any one of Examples 19-22, wherein the first material layers comprise silicon and germanium and the second material layers comprise silicon.

Example 24 includes the subject matter of any one of Examples 19-23, further comprising removing the first material layers from the first multilayer fin and the first material layers from the second multilayer fin.

Example 25 includes the subject matter of any one of Examples 19-24, wherein the masking comprises forming a carbon hard mask over the second multilayer fin.

Example 26 includes the subject matter of any one of Examples 19-25, wherein performing the lateral etching process comprises using an etching process that has substantially a same etch rate through each of the first material layers and the second material layers.

Example 27 includes the subject matter of any one of Examples 19-26, further comprising doping the second material layers of the first multilayer fin with p-type dopants and doping the second material layers of the second multilayer fin with n-type dopants.

The foregoing description of the embodiments of the disclosure has been presented for the purposes of illustration and description. It is not intended to be exhaustive or to limit the disclosure to the precise forms disclosed. Many modifications and variations are possible in light of this disclosure. It is intended that the scope of the disclosure be limited not by this detailed description, but rather by the claims appended hereto.

What is claimed is:

1. An integrated circuit comprising:
a first semiconductor device having a first semiconductor nanoribbon or nanowire extending between a first source region and a first drain region, the first semiconductor nanoribbon or nanowire having a first length and a first width, and a first subfin beneath the first semiconductor nanoribbon or nanowire and having the first width; and
a second semiconductor device having a second semiconductor nanoribbon or nanowire extending between a second source region and a second drain region, the second semiconductor nanoribbon or nanowire having a second length and a second width, the second width less than the first width, and a second subfin beneath the second semiconductor nanoribbon or nanowire and having the first width;
wherein semiconductor nanoribbon or nanowire length corresponds to a first distance between the corresponding source and drain regions, and semiconductor nanoribbon or nanowire width corresponds to a second distance between sidewalls of the corresponding nanoribbon or nanowire, the second distance extending in a horizontal direction that is orthogonal to a horizontal direction in which the first distance extends.

2. The integrated circuit of claim 1, wherein the first and second subfins each includes a tapered profile, and wherein sidewalls of the first subfin are collinear with the sidewalls of the first semiconductor nanoribbon or nanowire, and sidewalls of the second subfin are not collinear with the sidewalls of the second semiconductor nanoribbon or nanowire.

3. The integrated circuit of claim 1, wherein the first semiconductor device is an n-channel device and the second semiconductor device is a p-channel device.

4. The integrated circuit of claim 1, wherein the second width is at least 50% less than the first width.

5. The integrated circuit of claim 1, wherein an imaginary horizontal plane at least partially passes through each of the first and second semiconductor nanoribbons or nanowires.

6. A die comprising the integrated circuit of claim 1.

7. An electronic device, comprising:
a chip package comprising one or more dies, at least one of the one or more dies comprising
a first semiconductor device having a first body of semiconductor material extending between a first source region and a first drain region and having a first subfin beneath the first body of semiconductor material, the first body of semiconductor material having a first width that is substantially the same as a width of the first subfin; and
a second semiconductor device having a second body of semiconductor material extending between a second source region and a second drain region and having a second subfin beneath the second body of semiconductor material, the second body of semiconductor material having a second width that is less than a width of the second subfin and less than the first width;
wherein the first body of semiconductor material is a first semiconductor nanoribbon or nanowire, and the second body of semiconductor material is a second semiconductor nanoribbon or nanowire.

8. The electronic device of claim 7, wherein both the first subfin and the second subfin have substantially the same width.

9. The electronic device of claim 7, wherein the first and second subfins each includes a tapered profile, and wherein sidewalls of the first subfin are collinear with the sidewalls of the first body of semiconductor material, and sidewalls of the second subfin are not collinear with the sidewalls of the second body of semiconductor material.

10. The electronic device of claim 7, wherein the first semiconductor device is an n-channel device and the second semiconductor device is a p-channel device.

11. The electronic device of claim 7, wherein the second width is at least 50% less than the first width.

12. The electronic device of claim 7, wherein an imaginary horizontal plane at least partially passes through each of the first and second bodies of semiconductor material.

13. The electronic device of claim 7, further comprising a printed circuit board, wherein the chip package is attached to the printed circuit board.

14. An integrated circuit comprising:
a first semiconductor nanoribbon or nanowire extending in a first direction from a first source or drain region to a second source or drain region, the first semiconductor nanoribbon or nanowire having a first width in a second direction different from the first direction;
a first subfin beneath the first semiconductor nanoribbon or nanowire and having the first width;
a second semiconductor nanoribbon or nanowire extending in the first direction from a third source or drain region to a fourth source or drain region, the second semiconductor nanoribbon or nanowire having a second width in a second direction that is less than the first width;
a second subfin beneath the second semiconductor nanoribbon or nanowire and having the first width; and
a gate structure extending in the second direction over the first semiconductor nanoribbon or nanowire and the second semiconductor nanoribbon or nanowire.

15. The integrated circuit of claim 14, wherein the first semiconductor device is an n-channel device and the second semiconductor device is a p-channel device.

16. The integrated circuit of claim 14, wherein the second width is at least 50% less than the first width.

17. The integrated circuit of claim 14, wherein an imaginary horizontal plane extending along the first and second directions at least partially passes through each of the first and second semiconductor nanoribbons or nanowires.

18. The integrated circuit of claim 14, wherein sidewalls of the first subfin are collinear with the sidewalls of the first semiconductor nanoribbon or nanowire, and sidewalls of the second subfin are not collinear with the sidewalls of the second semiconductor nanoribbon or nanowire.

19. The integrated circuit of claim 1, wherein the second subfin has an inwardly curved top surface between a first portion of the second subfin that has the second width and a second portion of the second subfin that has the first width.

20. The integrated circuit of claim 14, wherein the second subfin has an inwardly curved top surface between a first portion of the second subfin that has the second width and a second portion of the second subfin that has the first width.

* * * * *